(12) United States Patent
Langhammer et al.

(10) Patent No.: US 10,340,920 B1
(45) Date of Patent: Jul. 2, 2019

(54) HIGH PERFORMANCE FPGA ADDITION

(71) Applicant: Intel Corporation, Santa Clara, CA (US)

(72) Inventors: Martin Langhammer, High Wycombe (GB); Tim Michael Vanderhoek, Toronto (CA); Jeffery Christopher Chromczak, Toronto (CA); Trevis Chandler, Dundas (CA)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/147,098

(22) Filed: Sep. 28, 2018

Related U.S. Application Data

(60) Provisional application No. 62/697,265, filed on Jul. 12, 2018.

(51) Int. Cl.
   *H03K 19/177* (2006.01)
   *G06F 7/503* (2006.01)
   *H03K 19/173* (2006.01)

(52) U.S. Cl.
   CPC ....... *H03K 19/17744* (2013.01); *G06F 7/503* (2013.01); *H03K 19/1737* (2013.01); *H03K 19/17724* (2013.01)

(58) Field of Classification Search
   None
   See application file for complete search history.

(56) References Cited

U.S. PATENT DOCUMENTS

| | | | | |
|---|---|---|---|---|
| 2003/0084084 | A1* | 5/2003 | Pham | G06F 7/507 708/700 |
| 2004/0128339 | A1* | 7/2004 | Kalampoukas | G06F 7/508 708/706 |
| 2006/0253523 | A1* | 11/2006 | Anders | G06F 7/507 708/706 |
| 2018/0006817 | A1* | 1/2018 | van Splunter | G06F 7/501 |
| 2019/0042194 | A1* | 2/2019 | Langhammer | G06F 7/505 |

* cited by examiner

*Primary Examiner* — Jany Richardson
(74) *Attorney, Agent, or Firm* — Fletcher Yoder, PC

(57) ABSTRACT

The present disclosure relates generally to techniques for enhancing adders implemented on an integrated circuit. In particular, arithmetic performed by an adder implemented to receive operands having a first precision may be restructured so that a set of sub-adders may perform the arithmetic on a respective segment of the operands. More specifically, the adder may be restructured so that a sub-adder of the set of sub-adders may concurrently output a generate signal and a propagate signal, which may both be routed to a prefix network. The prefix network may determine respective carry bit(s), which may carry into and/or select a sum at a subsequent sub-adder of the restructured adder. As a result, the integrated circuit may benefit from increased efficiencies, reduced latency, and reduced resource consumption (e.g., area and/or power) involved with implementing addition, which may improve operations such as encryption or machine learning on the integrated circuit.

20 Claims, 15 Drawing Sheets

HIGH PERFORMANCE FPGA ADDITION

CROSS REFERENCE TO RELATED APPLICATIONS

This application claims priority from and benefit of U.S. Provisional Application Ser. No. 62/697,265, filed Jul. 12, 2018, entitled "Multi-Input Reduction Structure for Very Large Integers," which is hereby incorporated by reference in its entirety for all purposes.

BACKGROUND

The present disclosure relates generally to integrated circuits, such as field-programmable gate arrays (FPGAs). More particularly, the present disclosure relates to adder circuitry to perform large arithmetic operations implemented using circuitry elements of an integrated circuit (e.g., programmable logic of an FPGA).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuits increasingly carry out functions, such as encryption, that have become essential to everyday life. Indeed, encryption is becoming increasingly valuable in a number of technical fields, such as financial transaction security. Encryption (as well as many other operations that may take place on an integrated circuitry, such as certain multiplication operations) may use increasingly large precision arithmetic that, in some cases, may involve a final addition operation to sum operands having a large precision. In some cases, for example, the precision of the operands may be on the order of thousands of bits. The final addition operation may be carried out by a final adder circuit. However, since the final adder circuit may include smaller adder circuits chained together to accommodate the large precision arithmetic involved with summing the operands, the final adder circuit may represent a critical path for an encryption and/or multiplication operation implemented on an integrated circuit. In fact, the final adder may consume a relatively large area of the integrated circuit, consume a relatively large amount of power, and/or produce additional latency in the integrated circuit.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
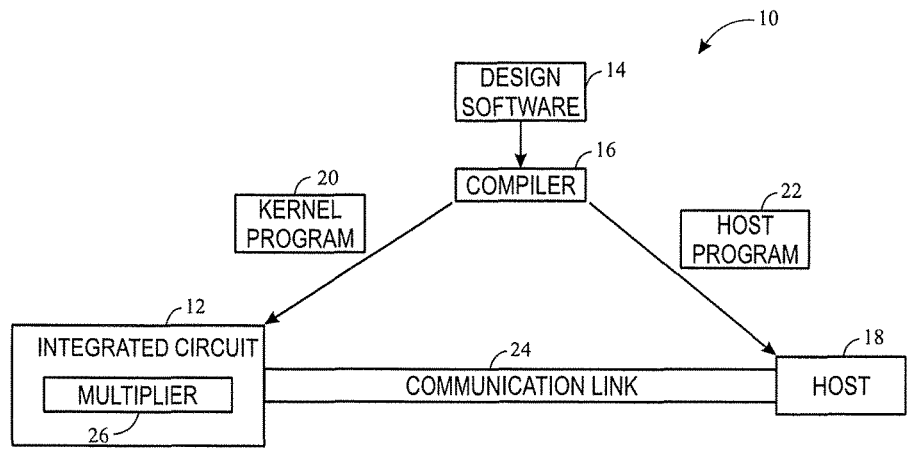
FIG. 1 is a block diagram of a system for implementing arithmetic operations, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Further, it is noted that, as referred to in the disclosure, the term "ripple carry adder" generally refers to an adder circuit structure implemented so that the carry-out of a full adder is fed (e.g., rippled) into the carry-in position of a subsequent, more significant full adder of the ripple carry adder. As additionally referred to in the disclosure, the term "carry propagate adder" may refer to an adder circuit that may be constructed from multiple smaller adder circuits, such as ripple carry adders. Further, as referred to in the disclosure, the term "adaptive logic module" may refer to a unit of circuitry that may be used to perform an arithmetic operation. Moreover, as referred to in the disclosure, the term "logic array block" may refer to a number of adaptive logic modules arranged (e.g., communicatively coupled) together to perform one or more arithmetic and/or combinatorial operations.

As discussed in further detail below, embodiments of the present disclosure relate generally to reducing the area of an integrated circuit consumed by and/or the latency resulting from an adder circuit. More specifically, the present disclosure relates to more efficient mapping of adders suitable to perform large arithmetic operations, such as a final adder used to perform a multiplication operation, to programmable logic. In some cases, a carry propagate adder circuit, such as the final adder used to perform a multiplication, may be implemented with ripple carry adders. Further, to construct a carry propagate adder with a suitable precision and/or to fit the carry propagate adder onto an integrated circuit, a set of adders having smaller precisions (e.g., sub-adder circuits) may be chained and/or pipelined together, and the input and/or output datapaths associated with each of the set of sub-adders chained and/or pipelined together may be delay balanced with one another. As delay balancing may use significant registers and/or memory, the carry propagate adder may result in significant area, latency, and/or power concerns on an integrated circuit Accordingly, to reduce the area, power, and/or latency involved with implementing the adder to programmable logic, the adder may be restructured so that the set of sub-adders are not chained and/or pipelined together (e.g., dependent on the latency of one another). As will be discussed in further detail below, restructuring the adder may also involve routing a respective generate and a respective propagate signal determined at each of the set of sub-adders to a prefix network circuit implemented to produce a suitable respective carry bit to carry into a subsequent sub-adder in the set of sub-adders. Further, to reduce resources involved with outputting the generate and the propagate signals, the sub-adders may be implemented to concurrently output the respective generate signal and the respective propagate signal (e.g., to make the respective generate signal and the respective propagate signal available concurrently). The sub-adders may additionally be implemented to concurrently output a respective sum along with the generate signal and the propagate signal. More specifically, in some embodiments, a sub-adder may be implemented using logic array block, which may include a number of units of circuitry, such as an adaptive logic module. The logic array block may be structured to include a propagate logic path (e.g., hard logic path) for a propagate signal and a generate logic path (e.g., carry-chain) for the generate signal (e.g., the carry-out signal of an addition operation). Using the propagate logic path and the generate logic path, logic array block may be implemented to output the propagate signal in the same logic array block or in a subsequent logic array block, along with the generate signal and a sum. Moreover, restructuring the sub-adders may include any suitable combination of the techniques described above.

With the foregoing in mind, FIG. 1 illustrates a block diagram of a system 10 that may implement arithmetic operations. A designer may desire to implement functionality, such as the large precision arithmetic operations of this disclosure, on an integrated circuit device 12 (such as a field-programmable gate array (FPGA) or an application-specific integrated circuit (ASIC)). In some cases, the designer may specify a high-level program to be implemented, such as an OpenCL program, which may enable the designer to more efficiently and easily provide programming instructions to configure a set of programmable logic cells for the integrated circuit device 12 without specific knowledge of low-level hardware description languages (e.g., Verilog or VHDL). For example, because OpenCL is quite similar to other high-level programming languages, such as C++, designers of programmable logic familiar with such programming languages may have a reduced learning curve than designers that are required to learn unfamiliar low-level hardware description languages to implement new functionalities in the integrated circuit device 12.

The designers may implement their high-level designs using design software 14, such as a version of Intel® Quartus® by INTEL CORPORATION. The design software 14 may use a compiler 16 to convert the high-level program into a lower-level description. The compiler 16 may provide machine-readable instructions representative of the high-level program to a host 18 and the integrated circuit device 12. The host 18 may receive a host program 22 which may be implemented by the kernel programs 20. To implement the host program 22, the host 18 may communicate instructions from the host program 22 to the integrated circuit device 12 via a communications link 24, which may be, for example, direct memory access (DMA) communications or peripheral component interconnect express (PCIe) communications. In some embodiments, the kernel programs 20 and the host 18 may enable configuration of a multiplier 26 on the integrated circuit device 12. The multiplier 26 may include circuitry and/or other logic elements and may be configured to implement, for example, encryption and/or arithmetic operations.

While the techniques described herein relate to the application of a high-level program, in some embodiments, the designer may use the design software 14 to generate and/or to specify a low-level program, such as the low-level hardware description languages described above. Further, in some embodiments, the system 10 may be implemented without a separate host program 22. Moreover, in some embodiments, the techniques described herein may be implemented in circuitry as a non-programmable circuit design. Thus, embodiments described herein are intended to be illustrative and not limiting.

Figure 2:
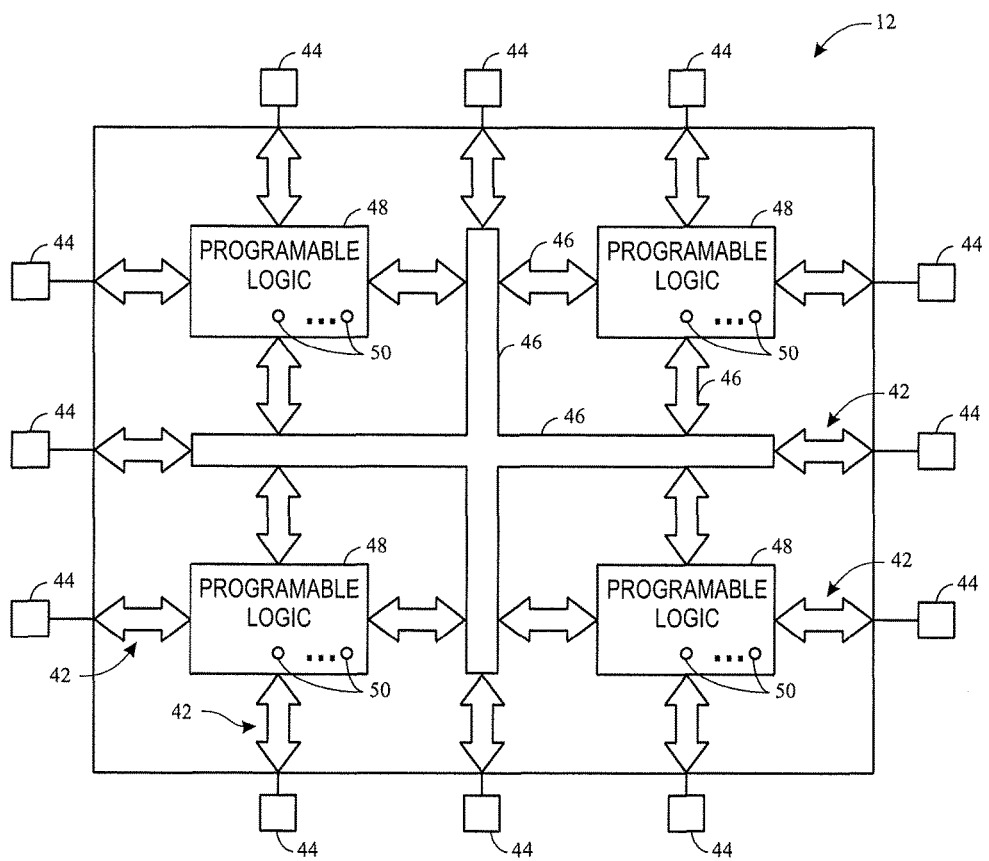
FIG. 2 is a block diagram of an integrated circuit where adders may be implemented, in accordance with an embodiment.

Turning now to a more detailed discussion of the integrated circuit device 12, FIG. 2 illustrates an example of the integrated circuit device 12 as a programmable logic device, such as a field-programmable gate array (FPGA). Further, it should be understood that the integrated circuit device 12 may be any other suitable type of programmable logic device (e.g., an application-specific integrated circuit and/or application-specific standard product). As shown, integrated circuit device 12 may have input/output circuitry 42 for driving signals off device and for receiving signals from other devices via input/output pins 44. Interconnection resources 46, such as global and local vertical and horizontal conductive lines and buses, may be used to route signals on integrated circuit device 12. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48.

Programmable logic devices, such as integrated circuit device 12, may contain programmable elements 50 with the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using pins 44 and input/output circuitry 42. In one embodiment, the memory cells may be implemented as random-access-memory (RAM) cells. The use of memory cells based on RAM technology is described herein is intended to be only one example. Further, because these RAM cells are loaded with configuration data during programming, they are sometimes referred to as configuration RAM cells (CRAM). These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Figure 3:
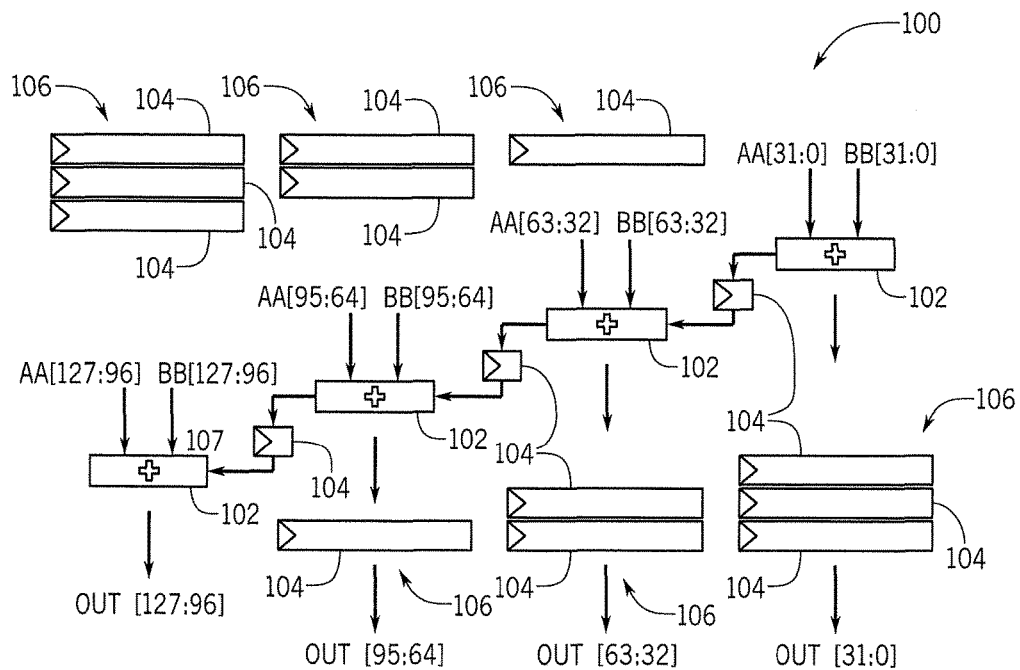
FIG. 3 is a block diagram of a pipelined adder, in accordance with an embodiment.

Turning now to FIG. 3, a pipelined adder 100 (e.g., adder circuitry), such as a carry propagate adder (CPA), which may handle the summation of large operands by decomposing the operands into smaller segments, is illustrated. In the illustrated embodiment, the pipelined adder 100 receives two, 128-bit operands, AA[127:0] and BB[127:0], which are each separated into four, 32-bit segments (e.g., AA[31:0], AA[63:32], AA[95:64], and AA[127:96] and BB[31:0], BB[63:32], BB[95:64], and BB[127:96], respectively). By separating the two 128-bit operands into smaller (e.g., 32-bit) segments (e.g., operand segments), the sum of the two 128-bit operands may be determined with a set of four 32-bit sub-adders 102, which may be implemented as ripple carry adders, that are pipelined together. Thus, as illustrated in FIG. 3, a first sub-adder 102 may sum AA[31:0] and BB[31:0], a second sub-adder 102 may sum AA[63:32] and BB[63:32] with a first carry-in value received from the first sub-adder 102, a third sub-adder 102 may sum AA[95:64] and BB[95:64] with a second carry-in value received from the second sub-adder 102, and a fourth sub-adder 102 may sum AA[127:96] and BB[127:96] with a third carry-in value received from the third sub-adder 102.

To use the first carry-in value during the summation of AA[63:32] and BB[63:32], the operand segments AA[63:32] and BB[63:32] input to the second sub-adder 102 may be delayed by one or more clock cycles to arrive concurrently with the first carry-in value. For example, because the result (e.g., the carry-out) of the addition of AA[31:0] and BB[31:0] is used as the first carry-in value in the summation of AA[63:32] and BB[63:32], the summation of AA[63:32] and BB[63:32] may be delayed until the carry-out from the first sub-adder 102, which may be stored in a register 104, is available. In some embodiments, to delay the operand segments AA[63:32] and BB[63:32], the pipelined adder 100 may route the operand segments AA[63:32] and BB[63: 32] through a first delay chain 106, which may be implemented with one or more registers 104, memory, a first-in-first-out (FIFO) data structure, and/or the like, prior to receiving the operand segments AA[63:32] and BB[63:32] at the second sub-adder 102. Further, to suitably delay the operand segments AA[95:64] and BB[95:64], the pipelined adder 100 may route the operand segments AA[95:64] and BB[95:64] through a second delay chain 106, which, in some embodiments, may delay the operand segments AA[95:64] and BB[95:64] from arriving at the third sub-adder 102 for two or more clock cycles so that the operand segments AA[95:64] and BB[95:64] are available at the third sub-adder 102 concurrently with the second carry-in value received from the second sub-adder 102. Accordingly, the pipelined adder 100 may include a third delay chain 106 to delay the operand segments AA[127:96] and BB[127:96] three or more clock cycles prior to their arrival at the fourth sub-adder 102 so that the operand segments AA[127:96] and BB[127:96] are concurrently available with the third carry-in value received from the third sub-adder 102.

Further, by concatenating the output of the first 32-bit adder 102 with the outputs of the second sub-adder 102, the third sub-adder 102, and the fourth sub-adder 102, the 128-bit sum of AA[127:0] and BB[127:0] may be formed. Since the first sub-adder 102 may calculate and output the sum of the operand segments AA[31:0] and BB[31:0] before any of the other sub-adders 102 (e.g., the second sub-adder 102, the third sub-adder 102, and the fourth sub-adder 102), the pipelined adder 100 may be implemented to route the output of the first sub-adder 102 through a fourth delay chain 106. The fourth delay chain may delay the output of the first sub-adder 102 a number of clock cycles that may be dependent on the number of sub-adders 102 following the first sub-adder 102 in the pipelined adder 100. Accordingly, in the illustrated embodiment, the fourth delay chain 106 may delay the output of the first sub-adder 102 three clock cycles, but in other embodiments, the fourth delay chain 106 may be implemented to delay the output of the first sub-adder 102 a greater or fewer number of clock cycles. Further, the pipelined adder 100 may route the output of the second sub-adder 102 through a fifth delay chain 106 and the output of the third sub-adder 102 through a sixth delay chain 106 so that the outputs of each of the sub-adders 102 are available concurrently.

While the techniques described above reference a 128-bit pipelined adder 100, which includes four, 32-bit sub-adders 102 pipelined together, in some embodiments, pipelined adder 100 may be implemented with larger precision, such as a 1024-bit pipelined adder 100 and/or another suitable size. In such cases, the pipelined adder 100 may be decomposed into a greater number of sub-adders 102, such as 32, 32-bit sub-adders 102. Further, the delay chains 106 may be implemented to increase the latency (e.g., delay) before inputs to and/or outputs from a sub-adder 102 are made available. Additionally or alternatively, the precision of the operand segments and/or the sub-adders 102 may be increased or decreased, and in some embodiments, the precision of the operand segments and/or the sub-adders 102 may be determined based in part on the precision of the integrated circuit device 12. In any case, examples described herein are intended to be illustrative, and not limiting.

In some embodiments, the delay chains 106 of the pipelined adder 100 may use significant resources in the integrated circuit device 12, as the delay chains 106 may occupy a significant area in the integrated circuit device 12 and/or consume significant power in the integrated circuit device 12. Further, because each sub-adder 102 of the pipelined adder 100 is arithmetically connected to the previous sub-adder 102 in the pipelined adder 100 (e.g., the second sub-adder 102 is arithmetically dependent on the first sub-adder 102), integrated circuit device 12 may fit the pipelined adder 100 in a contiguous area of the integrated circuit device 12, which may limit and/or restrict the use of available area in the integrated circuit device 12. Moreover, because the sub-adders 102 are not independent, addition performed by the pipelined adder 100 may incur significant latencies to suitably delay input operand segments and outputs of the sub-adders 102.

Figure 4:
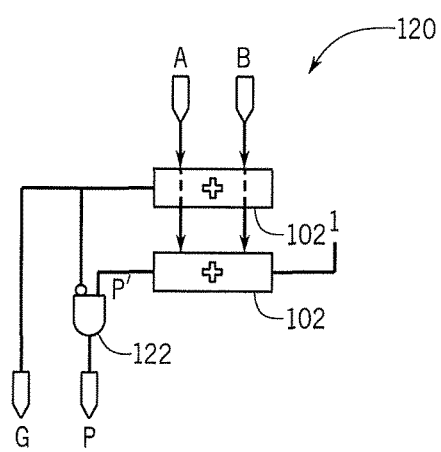
FIG. 4 is a block diagram of a decoder circuit, in accordance with an embodiment.

Accordingly, as illustrated in FIG. 4, a decoder 120 may be implemented to decode a generate signal (G) and/or a propagate signal (P) from a set of independent sub-adders 102. In some embodiments, as described in greater detail below, a restructured adder may use the generate signal and/or propagate signal to determine the sum of two operand segments (e.g., AA[31:0] and BB[31:0]) at a sub-adder 102 independently from the output and/or carry-out value generated by another sub-adder 102.

To decode the generate signal, the decoder 120 may, using a sub-adder 102, determine a carry-out signal resulting from the sum of a first operand segment (A) and a second operand segment (B). In some embodiments, the decoder 120 may directly route the generate signal (e.g., carry-out signal) from the carry-chain of a sub-adder 102 of the decoder 120. Additionally or alternatively, the decoder 120 may output the generate signal from logic by, for example, zero extending the most significant bit of the sub-adder 102. The decoder 120 may route the resulting generate signal to a logical AND gate 122, which may use the complement of the generate signal to generate the propagate signal. For example, the logical AND gate 122 of the decoder may receive the complement of the generate signal and a propagate' signal (P') (e.g., a precursor to the propagate signal), which may be generated by an additional sub-adder 102 implemented to sum the first operand segment and the second operand segment with a carry-in value of 1, as inputs and may determine the logical AND of these inputs (NOT (G) AND P') to generate the propagate signal (P).

Figure 5:
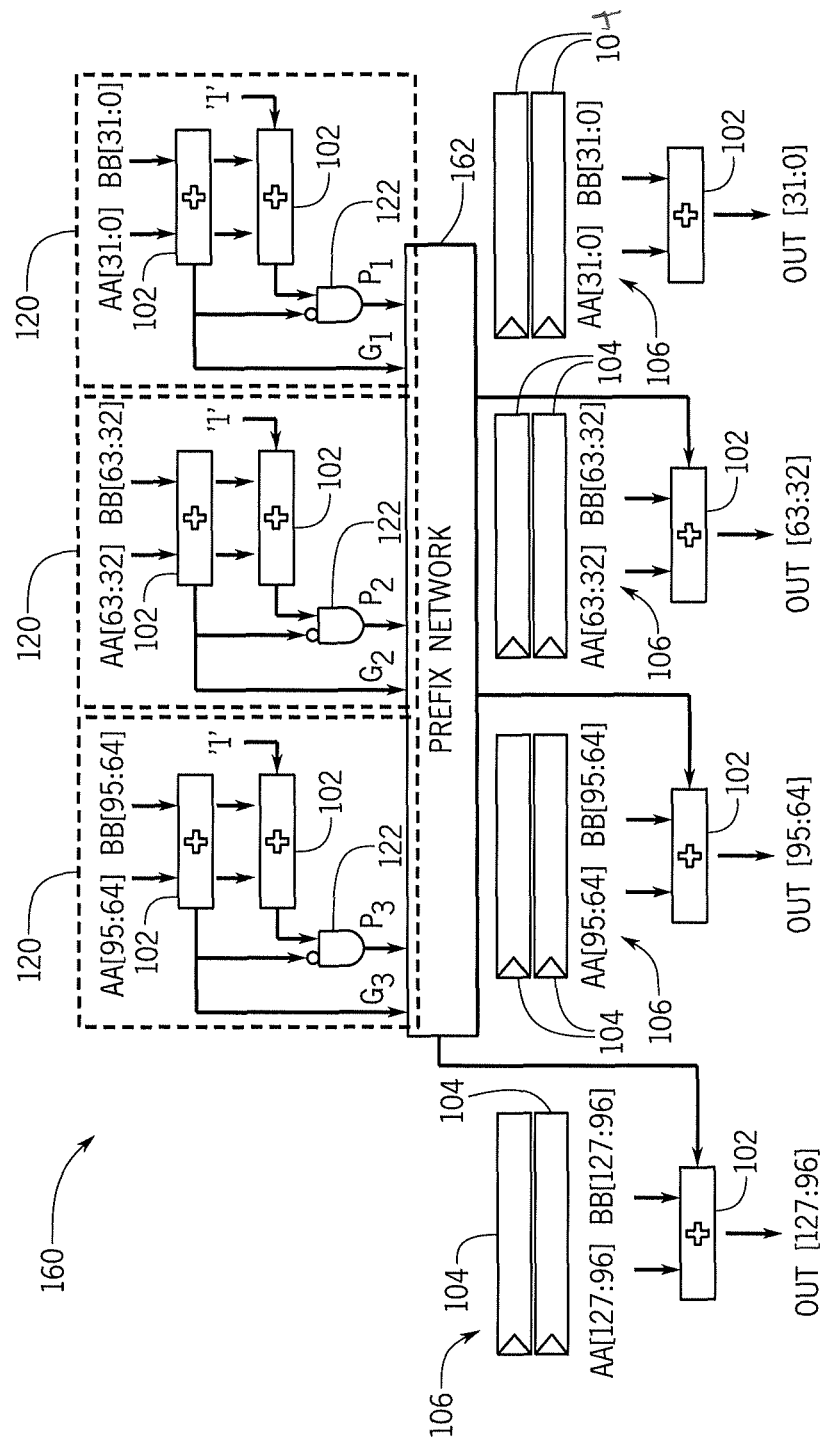
FIG. 5 is a block diagram of a restructured adder, in accordance with an embodiment.

As discussed above, a restructured adder may use the generate signal and propagate signal to determine one or more sums at one or more sub-adders 102 independent of the outputs of one or more additional sub-adders 102. Accordingly, FIG. 5 illustrates a restructured adder 160 (e.g., adder circuitry) implemented to use a decoder 120 and a prefix network 162 to determine the sum of two operands. More specifically, using the decoder 120 and the prefix network 162, the restructured adder 160 may determine the sum of two operands, each having a first precision, based in part on the sum of corresponding pairs of segments of the two operands (e.g., pairs of operand segments), each having a second precision, which may be a smaller precision than the first precision.

As shown in the illustrated embodiment, the restructured adder 160 may include a decoder 120 for each pair of operand segments. For example, the restructured adder 160 may include a first decoder 120 implemented to decode a generate signal and/or a propagate signal resulting from a first pair of operand segments AA[31:0] and BB[31:0] (e.g., G1 and P1, respectively), a second decoder implemented to decode a generate signal and/or a propagate signal resulting from a second pair of operand segments AA[63:32] and BB[63:32] (e.g., G2 and P2, respectively), and a third decoder implemented to decode a generate signal and/or a propagate signal resulting from a third pair of operand segments AA[95:64] and BB[95:64] (e.g., G3 and P3, respectively). While not shown, each of the first pair of operand segments, the second pair of operand segments, and the third pair of operand segments may route from first input circuitry and second input circuitry of the restructured adder 160 implemented to receive the first operand (AA) and the second operand (BB), respectively. Further, as discussed above, the generate signal and propagate signal decoded at each decoder 120 are generated independently from the other generate and propagate signals and from the value of the other pairs of operand segments. Accordingly, the decoders 120 and/or the operand segments input to a respective decoder 120 may be placed on the integrated circuit device 12 in areas separate and remote from one another instead of within a contiguous area. As such, in some embodiments, fitting the restructured adder 160 onto the integrated circuit device 12 may be less cumbersome than fitting the pipelined adder 100.

The generate signal and propagate signal from each decoder 120 may feed into the prefix network 162, such as a soft logic prefix network. The prefix network 162 may be constructed out of combinatorial logic (e.g., combinatorial circuitry) and the layout of the prefix network 162 may be flexible. Accordingly, in some embodiments, the prefix network 162 may be implemented with a Kogge-Stone topology, a Brent-Kung topology, a Sklansky topology, a pipelined topology, and/or any other suitable topology. In any case, the prefix network 162 may be implemented to receive the generate signal and the propagate signal from a decoder 120 as inputs and to generate a carry bit based on the received generate signal and the received propagate signal. The restructured adder 160 may feed the generated carry bit into an input of a sub-adder 102 implemented to sum the pair of operand segments following (e.g., having an immediately more significant bit position) the pair of operand segments input to the decoder 120 responsible for producing the generate signal and the propagate signal corresponding to the carry bit. For example, the prefix network 162 may generate the respective carry-out bit corresponding to each of the summations performed by the sub-adders 102 and may route the carry-out bit to the carry-in position of a respective subsequent sub-adder 102. Accordingly, the restructured adder 160 may mimic the carry-chain used by the pipelined adder 100 to feed each carry-out bit from a preceding sub-adder 102 to a following sub-adder 102 using the prefix network 162. Further, as discussed above, by replacing the carry-chain with the prefix network 162 and the decoders 120, the restructured adder 160 may be used to generate sums of pairs of operand segments independently of one another. Accordingly, a decoder 120 and/or a sub-adder 102 may be fit onto integrated circuit device 12 separately from an additional decoder 120 and/or sub-adder, which may reduce the area of the integrated circuit device 12 used to perform summations.

In some embodiments, to ensure a pair of operand segments are available at a final sub-adder 102 of the restructured adder 160 concurrently with the corresponding carry-out bit generated by the prefix network 162, the restructured adder 160 may include a delay chain 106 implemented to delay the pair of operand segments a suitable number of clock cycles to compensate for any pipelining implemented in the topology of the prefix network 162. In such embodiments, each of the delay chains 106 included in the restructured adder 160 may implement the same delay (e.g., the same number of clock cycles). Further, because the addition of the least significant pair of operand segments (e.g., AA[31:0] and BB[31:0]) does not include a carry-in, the sum of the least significant pair of operand segments may be implemented by delaying production of the least significant generate signal. Moreover, in some embodiments, the restructured adder 160 may be implemented such that an equivalent number of cycles of latency are applied to each pair of operand segments input to the restructured adder 160.

Although the restructured adder 160 may appear more complex than the pipelined adder 100, the depth (e.g., number of stages and/or latency) of the restructured adder 160 may remain relatively constant, regardless of the precision of the restructured adder 160. For example, a restructured adder 160 with a precision of 1024-bits may include a wider (e.g., higher precision) prefix network 162 than the illustrated embodiment of the restructured adder 160, which has a precision of 128-bits, but because the prefix network 162 may be constructed with combinatorial logic, increasing the width (e.g., precision) of the prefix network 162 may not increase the depth and/or the latency of the restructured adder 160. Accordingly, the depth of the delay chains 106 used at the output of the prefix network 162 may remain the same between the restructured adder 160 with the precision of 1024-bits and the illustrated restructured adder 160. The depth of the pipelined adder 100, on the other hand, may increase by 1 with each additional sub-adder 102 used to sum each additional pair of operand segments, as the pipelined adder 100 may include an additional stage of pipelining (e.g., carry-chain). Accordingly, the latency produced by the delay chains 106 of the pipelined adder 100 may increase as the precision of the pipelined adder 100 increases.

Figure 6:
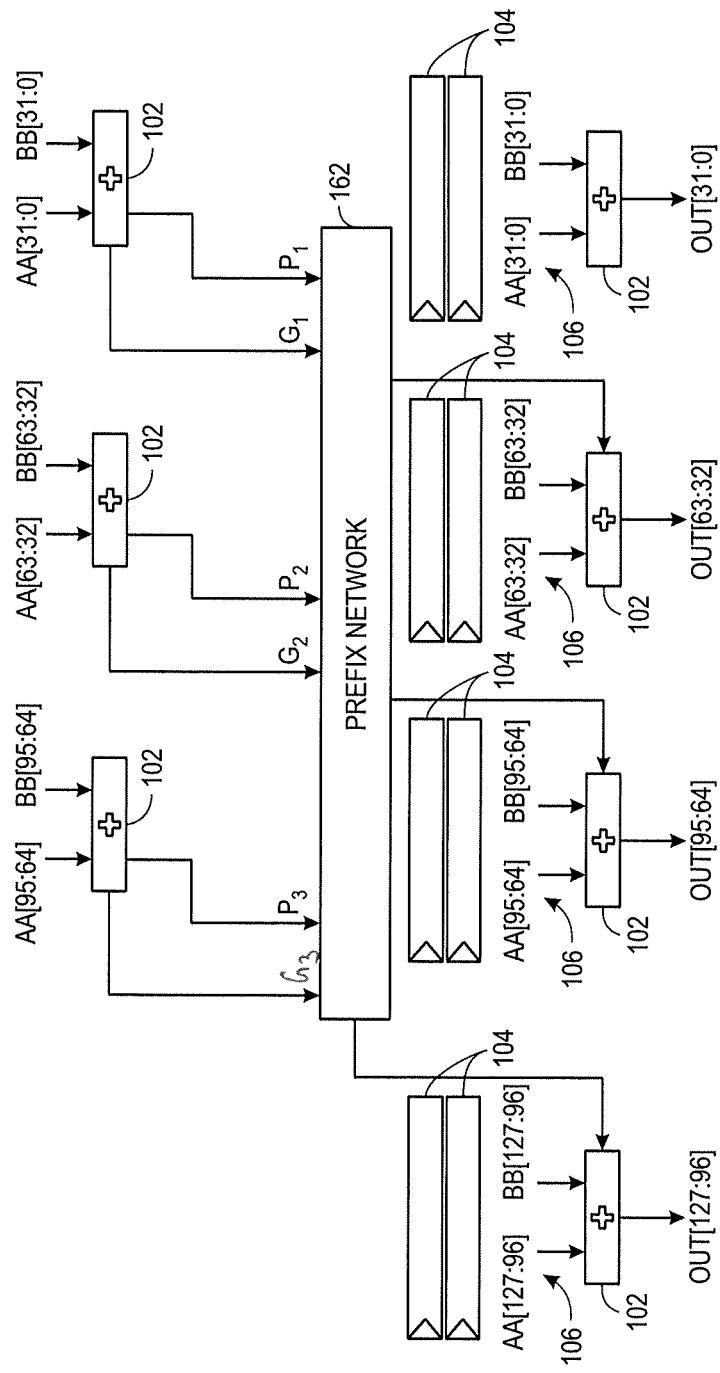
FIG. 6 is a block diagram of the restructured adder including a sub-adder implemented to concurrently output a generate signal and a propagate signal, in accordance with an embodiment.

Further, in some embodiments, calculating the generate signal (G) and the propagate signal (P) separately (e.g., with a pair of sub-adders 102) may consume significant resources (e.g., area, routing, current, and/or the like) of the integrated circuit device 12. For example, the value 3N may represent the arithmetic cost of a large, N-bit adder (e.g., restructured adder 160 of FIG. 5). However, by simultaneously calculating the generate signal and the propagate signal, the arithmetic cost of the N-bit adder may be reduced to 2N, which may result in significant resource (e.g., placement and routing, area, and/or the like) and/or performance (e.g., latency) benefits in the integrated circuit device 12. Accordingly, in some embodiments, the decoder 120 may be restructured to concurrently determine the generate signal and the propagate signal, as illustrated in FIG. 6. More specifically, as described in greater detail below, the circuitry and/or logic used to implemented the sub-adders 102 may be restructured according to one or more techniques.

Figure 7:
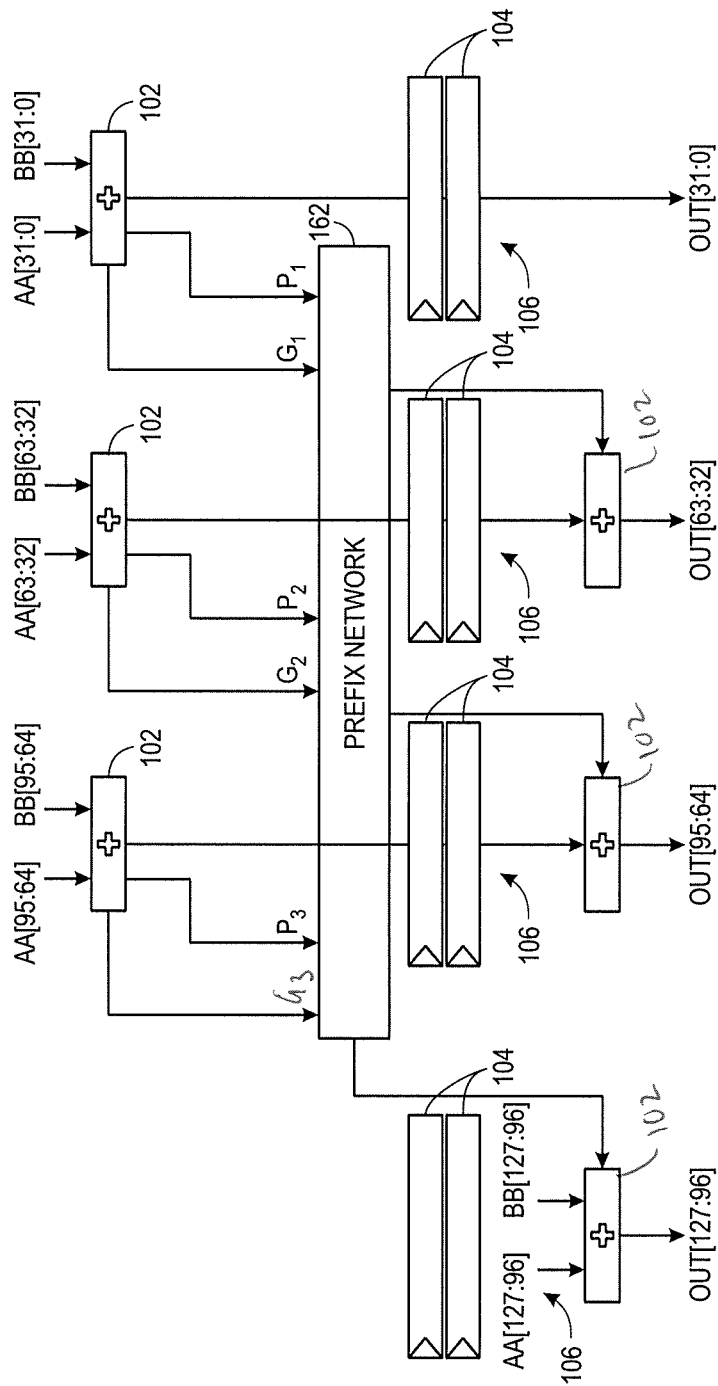
FIG. 7 is a block diagram of the restructured adder including a sub-adder implemented to concurrently output a generate signal, a propagate signal, and a sum, in accordance with an embodiment.

Moreover, as illustrated in FIG. 7, in some embodiments, each of the propagate signal, the generate signal, and a sum may be determined concurrently within the sub-adder 102. Accordingly, in such embodiments, the sum of a pair of operand segments may be pipelined directly to a corresponding final sub-adder 102. For example, the restructured adder 160 may route the sum generated by the first sub-adder 102 to bypass the prefix network 162 and serve as an input, along with the carry-in value determined by the prefix network 162, to the final sub-adder 102. As such, the final sub-adder 102 may add the sum generated by the first sub-adder 102 with the carry-in value to generate the output segment. As a result, the restructured adder 160 may be implemented with reduced routing compared to the embodiments of FIGS. 5-6, which may result in a more efficient integrated circuit device 12.

Figure 8:
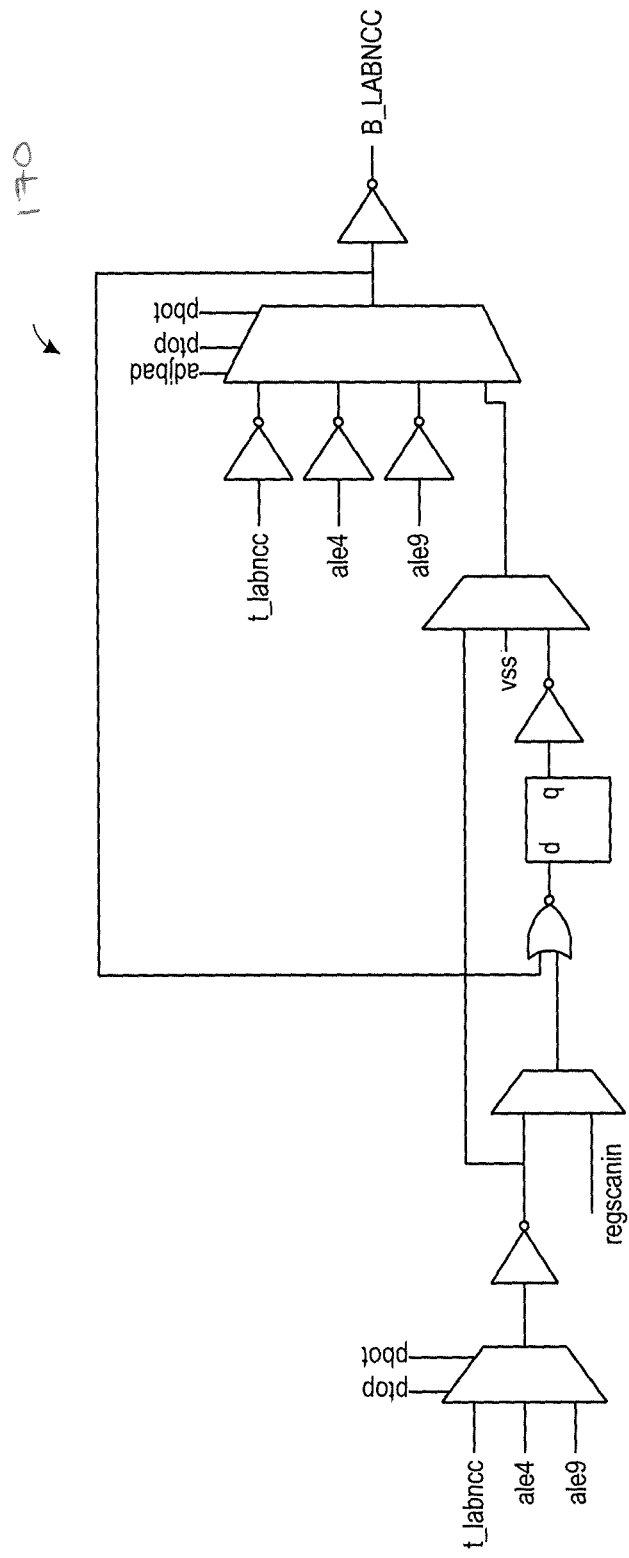
FIG. 8 is a block diagram of support circuitry of a logic array block (LAB), in accordance with an embodiment.

Turning now to FIG. 8, support circuitry 170 is illustrated. More specifically, as described in greater detail below, a structure known as a logic array block (LAB), which may be used to perform one or more arithmetic and/or combinatorial operations (e.g., addition), may include the support circuitry 170. In some embodiments, the logic array block may include a number (e.g., 5, 10, 20, and/or the like) of adaptive logic modules (ALM) (e.g., arithmetic logic circuitry) arranged (e.g., communicatively coupled) together. It may be appreciated that an adaptive logic module may represent a unit of circuitry that may be used to perform an arithmetic operation. Accordingly, in some embodiments, the sub-adders 102 may be implemented using a number of logic array blocks, which may each include a number of adaptive logic modules and/or may include the support circuitry 170.

The illustrated support circuitry 170 includes circuitry to determine and/or route a propagate signal. More specifically, the illustrated support circuitry 170 includes circuitry associated with a first portion (e.g., a first number of bits) of the propagate signal (ptop) and a second portion (e.g., a second number of bits) of the propagate signal (pbot). In some embodiments, because a group of adaptive logic modules may be communicatively coupled together (e.g., within a logic array block), a first set of adaptive logic modules may determine the first portion of the propagate signal (ptop) and a second set of adaptive logic modules may determine the second portion of the propagate signal (pbot). As such, the support circuitry 170 may be implemented to receive each portion (e.g., the first portion and the second portion) of the propagate signal. Moreover, the support circuitry 170 may be implemented to route each portion of the propagate signal across a first logic array block to a second logic array block and/or across a first and second portion of a logic array block (e.g., across one or more adaptive logic modules). For example, in some embodiments, the support circuitry 170 may be implemented to combine a signal, such as the propagate signal (e.g., the portions of the propagate signal), across two or more logic array blocks and/or adaptive logic modules.

While the propagate signal is described herein as being determined using a first and second portion (e.g., ptop and pbot, respectively), it may be appreciated that the propagate signal may be determined based on fewer or additional portions of the propagate signal. For example, in some embodiments, a third set of adaptive logic modules may determine a third portion of the propagate signal (pmid). In such embodiments, the propagate signal may be determined based in part on each of the first, second, and third portion of the propagate signal (e.g., ptop, pbot, and pmid). Moreover, each of the portions of the propagate signal may be determined based on the same or different number of bits. As such, the number of adaptive logic modules used to determine each portion may vary. For example, the first portion of the propagate signal (ptop) may be determined based in part on a first number of bits by a second number of adaptive logic modules, while the second portion of the propagate signal (pbot) may be determined based in part on a third number of bits different from the first number of bits by a fourth number of adaptive logic modules. Thus, embodiments are intended to be illustrative and not limiting.

Figure 9:
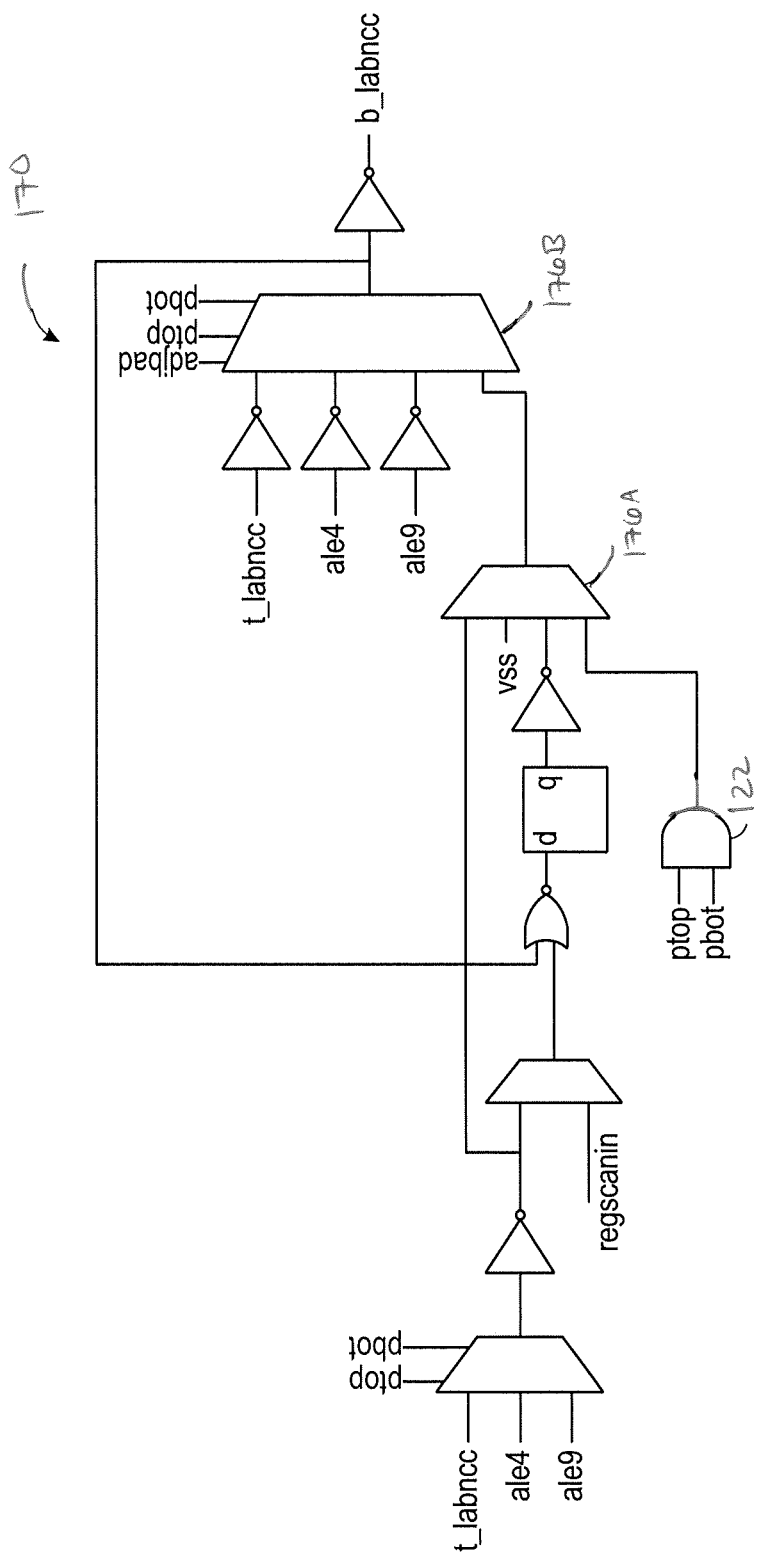
FIG. 9 is a block diagram of the support circuitry implemented to calculate a propagate signal based on a number of portions of the propagate signal, in accordance with an embodiment.

Moreover, to output a propagate signal, each of the portions (e.g., the first (ptop) and second (pbot)) of the propagate signal may be combined. More specifically, each portion of the propagate signal may be logically ANDed together to produce the propagate signal. To that end, as illustrated in FIG. 9, the support circuitry 170 may be modified to include a logical AND gate 122 implemented to logically AND the first and second portion of the propagate signal (e.g., ptop AND pbot). The logical AND gate 122 may be communicatively coupled to a multiplexer (mux) 176A (e.g., selection circuitry). In some embodiments, the output of the logical AND gate 122 may be routed to the mux 176A based in part on a timing criticality of the signal routing path.

For example, in the illustrated embodiment, the mux 176A may be used for testing (e.g., design for test (DFT)) and/or for retiming purposes, while the mux 176B may be used for combinational adders. As a result, routing into the mux 176B may represent a highly speed-critical path, while the mux 176A may represent a less timing critical path. Accordingly, in such embodiments, the result of logical AND gate 122 (e.g., the propagate signal) may be routed into the slower path of the mux 176A. Moreover, because adders, such as the pipelined adder 100 and/or the restructured adder 160, implemented to perform high-precision arithmetic may not need to run at the fastest rate the integrated circuit device 12 can achieve, improving placement and routing of circuitry on the integrated circuit device 12 may improve performance of the integrated circuit device 12 more readily than improving a timing of an operation. Accordingly, fitting the logical AND gate 122 into the support circuitry 170 may involve communicatively coupling the logical AND gate 122 to the mux 176A, which may consume less resources (e.g., area and/or wiring resources) of the integrated circuit device 12 than fitting the logical AND gate 122 to communicatively couple to the mux 176B.

Further, while the portions of the propagate signal are described herein as being combined by the logical AND gate 122, it may be appreciated that any suitable logic and/or circuitry may be used. For example, in some embodiments, any suitable combination of logical gates may be used to determine the logical AND of each of the portions of the propagate signal. Additionally or alternatively, the propagate signal may be computed in soft logic circuitry (not shown), which may be communicatively coupled to an adaptive logic module (e.g., coupled to an input and/or an output of the adaptive logic module). Moreover, embodiments described herein are intended to be illustrative and not limiting.

Figure 10:
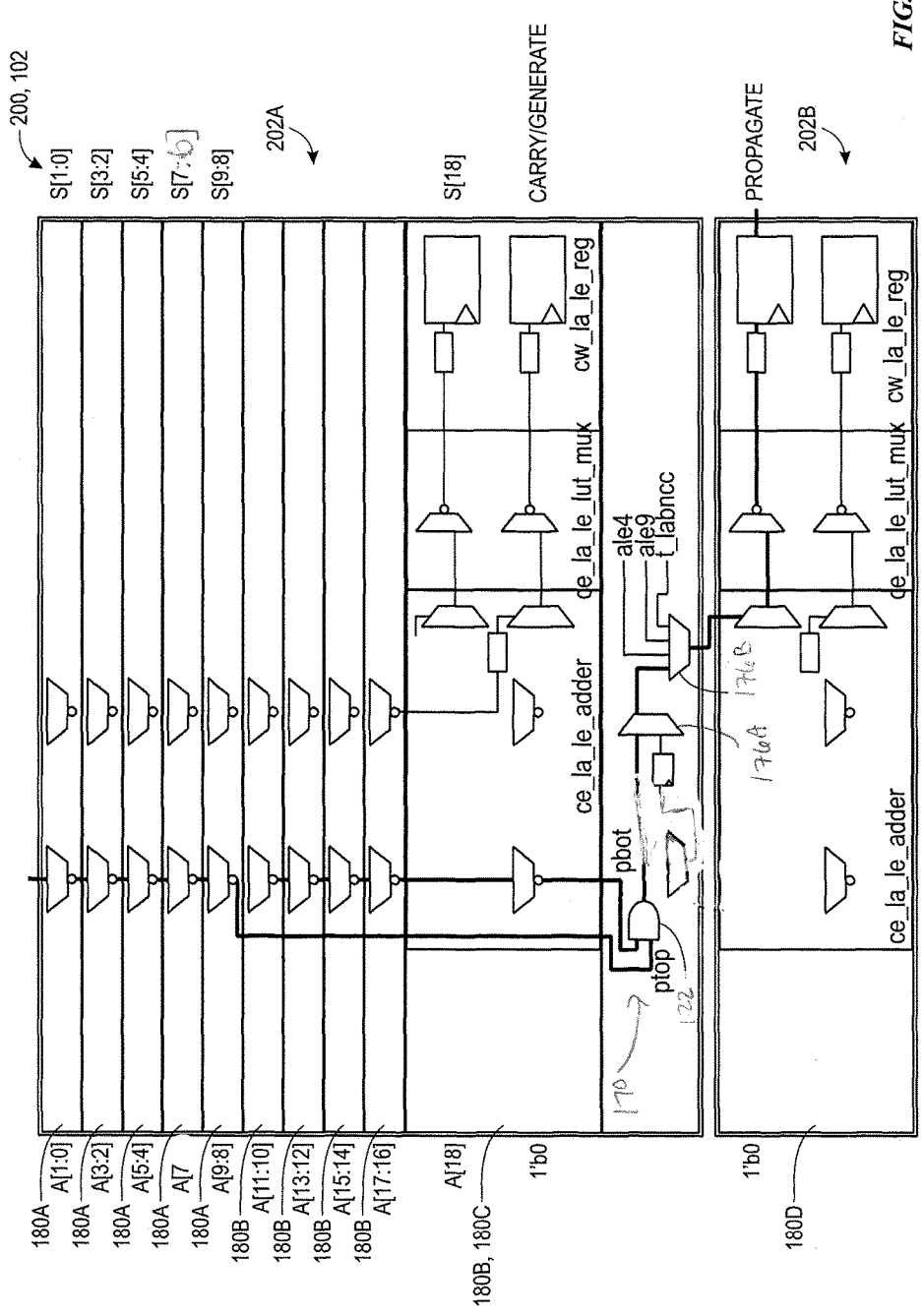
FIG. 10 is a block diagram of a first logic array structure, in accordance with an embodiment.

As an illustrative example, FIG. 10 depicts a first logic array structure 200 implemented to concurrently output a generate signal and a propagate signal. Accordingly, the first logic array structure 200 may implement the sub-adders 102 described above with reference to FIGS. 6 and/or 7. The first logic array structure 200 may include a first logic array block 202A, which may include a number of adaptive logic modules 180 and/or the support circuitry 170, and a portion of a second logic array block 202B. As illustrated, 20 bits of arithmetic are combined into the first logic array block 202A using a set of ten adaptive logic modules 180 (e.g., two bits of arithmetic per adaptive logic module 180). More specifically, the first logic array block 202A is implemented to perform 19 bits of addition and to include two zero (e.g., logical low) bits as inputs to the 20$^{th}$ bit of arithmetic. Accordingly, the illustrated first logic array block 202A is implemented to output a 19-bit sum (e.g., S[0:18]) and a carry value, which represents the generate signal.

Moreover, the first logic array structure 200 may include routing circuitry (e.g., carry-chain circuitry), such as wiring, selection circuitry (e.g., a number of multiplexers (muxes)), and/or the like to concurrently output the propagate signal along with the sum (S[0:18]) and the generate signal. For example, as illustrated, a number of the least significant adaptive logic modules 180 (e.g., 180A) of the first logic array block 202A may determine and route the first portion of the propagate signal (ptop) based at least in part on the least significant input values (e.g., a[0:9]) to the first logic array block 202A. Further, a number of the most significant adaptive logic modules 180 (e.g., 180B and 180C) of the first logic array block 202A may determine and route the second (e.g., remaining) portion of the propagate signal (pbot) based at least in part on the most significant input values (e.g., a[18:10]) to the first logic array block 202A. The support circuitry 170 of the first logic array block 202A may be implemented to include the logical AND gate 122 operatively coupled to a mux 176 with low timing criticality (e.g., mux 176A), as described above with reference to FIG. 9. Accordingly, the support circuitry 170 may calculate the propagate signal based in part on the first and second portion of the propagate signal (e.g., ptop and pbot, respectively), which may be routed into the input of the logical AND gate 122 from the least and most significant adaptive logic modules 180, respectively. Moreover, in some embodiments, each of the first portion of the propagate signal (pbot), the second portion of the propagate signal (ptop), and the resulting propagate signal may be determined independently from the generate signal. For example, each of the propagate signals and/or portions thereof may be determined without use of the generate signal.

Further, because the illustrated most significant adaptive logic module 180C is implemented to output the most significant bit of the sum (e.g., S[18]) and the generate signal, the first logic array structure 200 may use the portion of a second logic array block 202B to output the propagate signal. In some embodiments the carry signal resulting from a first logic array block 202 (e.g., 202A) may optionally be routed into a subsequent logic array block 202 (e.g., 202B) to implement a ripple-carry adder with higher precision (e.g., with a greater number of bits of arithmetic). In some embodiments, however, the support circuitry 170 of the first logic array block 202A may include a mux 176B implemented to select between the propagate signal and the carry signal, as illustrated. Accordingly, because the carry signal is output by the first logic array block 202A as the generate signal, the illustrated mux 176B may be implemented to select the propagate signal as an output routed into the second logic array block 202B. More specifically, the propagate signal may be selected to route into the input of the first (e.g., least significant) adaptive logic module 180D of the second logic array block 202B. The two input values to the adaptive logic module 180D may zeroed (e.g., logical low) such that the propagate signal is output (e.g., carried out) as the least significant bit resulting from the second logic array block 202B. Accordingly, a new arithmetic operation may be calculated and/or output beginning at the second bit of the second logic array block 202B.

For simplicity, the illustrated embodiment of the first logic array structure 200 includes simplified block diagrams of the adaptive logic modules 180 (e.g., 180A, 180B, 180C, and 180D). However, it may be appreciated that any suitable circuitry, such as the circuitry depicted in FIG. 11, and/or the like, may be implemented by the adaptive logic modules 180. Moreover, in some embodiments, the adaptive logic modules 180 may be implemented to perform more or fewer arithmetic operations (e.g., 1 bit, 3 bits, 4 bits, and/or the like). Additionally, in some embodiments, the adaptive logic modules 180 may be implemented to perform alternative adder functions. For example, the adaptive logic modules 180 may be implemented to calculate a sum using compression, redundant form arithmetic, and/or the like such that the propagate signal may be output from the first logic array block 202A without the use of the second logic array block 202. Thus, embodiments described herein are intended to be illustrative and not limiting.

Figure 11:
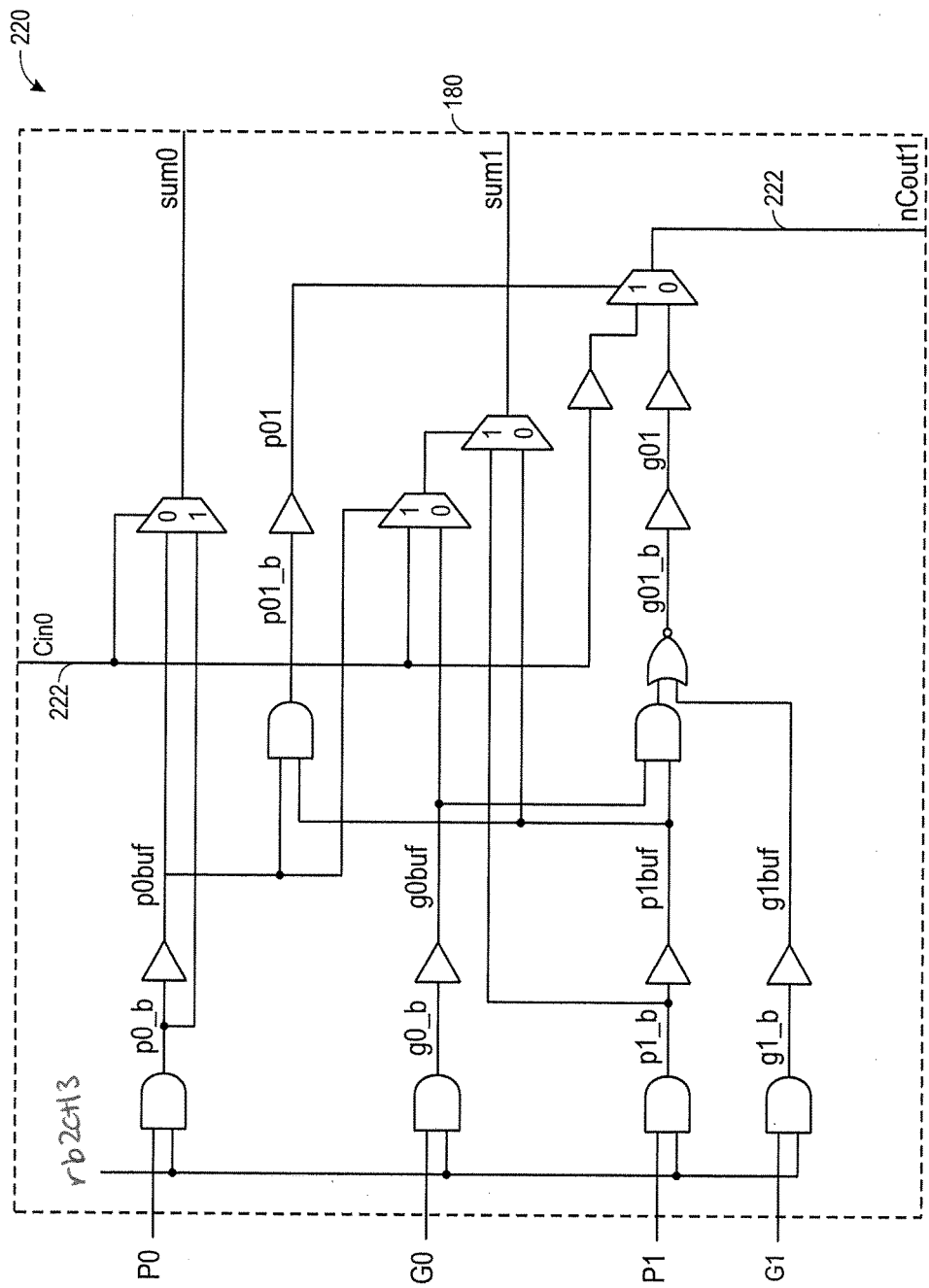
FIG. 11 is a block diagram of a carry-chain circuit, in accordance with an embodiment.

Turning now to FIG. 11, a block diagram 220 of an embodiment of an adaptive logic module 180 structure is illustrated. More specifically, the block diagram 220 illustrates an example of a carry-chain circuit in two bits of a logic array block 202, which may be represented by an adaptive logic module 180. In some embodiments, the carry-chain 222 (e.g., a logic path) may route a carry-in signal (e.g., Cin0) into the adaptive logic module 180, which may also receive a number of input signals (e.g., P0, G0, P1, G1). Further, the carry-chain 222 may route a carry-out single (e.g., nCout1), which may be inverted (e.g., complemented) compared to the carry-in signal. Accordingly, in some embodiments, the carry-chain 222 may be used to route a propagate signal and/or a generate through an adaptive logic module 180. For example, P0 may represent a zeroth propagate signal (e.g., portion of the propagate signal) corresponding to the zeroth bit position of arithmetic, P1 may represent a first propagate signal (e.g., portion of the propagate signal) corresponding to the first bit position of arithmetic, G0 may represent a zeroth generate signal corresponding to the zeroth bit position of arithmetic, and G1 may represent a first generate signal corresponding to the first bit position of arithmetic. Accordingly, the carry-chain circuitry may be used to carry out a portion of the propagate signal and/or the generate signal. For example, as discussed above, the illustrated adaptive logic module 180 may be coupled to a number of additional adaptive logic modules 180 to determine the first portion (ptop) or the second portion (pbot) of the propagate signal. Moreover, if the destination logic array block 202 (e.g., the logic array block 202 and/or the subsequent adaptive logic module 180 coupled to the adaptive logic module 180) is non-arithmetic, a gating signal (e.g., rb2ctl3) may be used to route the propagate signal out through the sum0 output position. Further, if the destination logic array block 202 is used for fractal arithmetic, a lutmask may be configured to set both P0 and P1 to one (e.g., logical high) to avoid breaking the propagate signal carry-chain.

Figure 12:
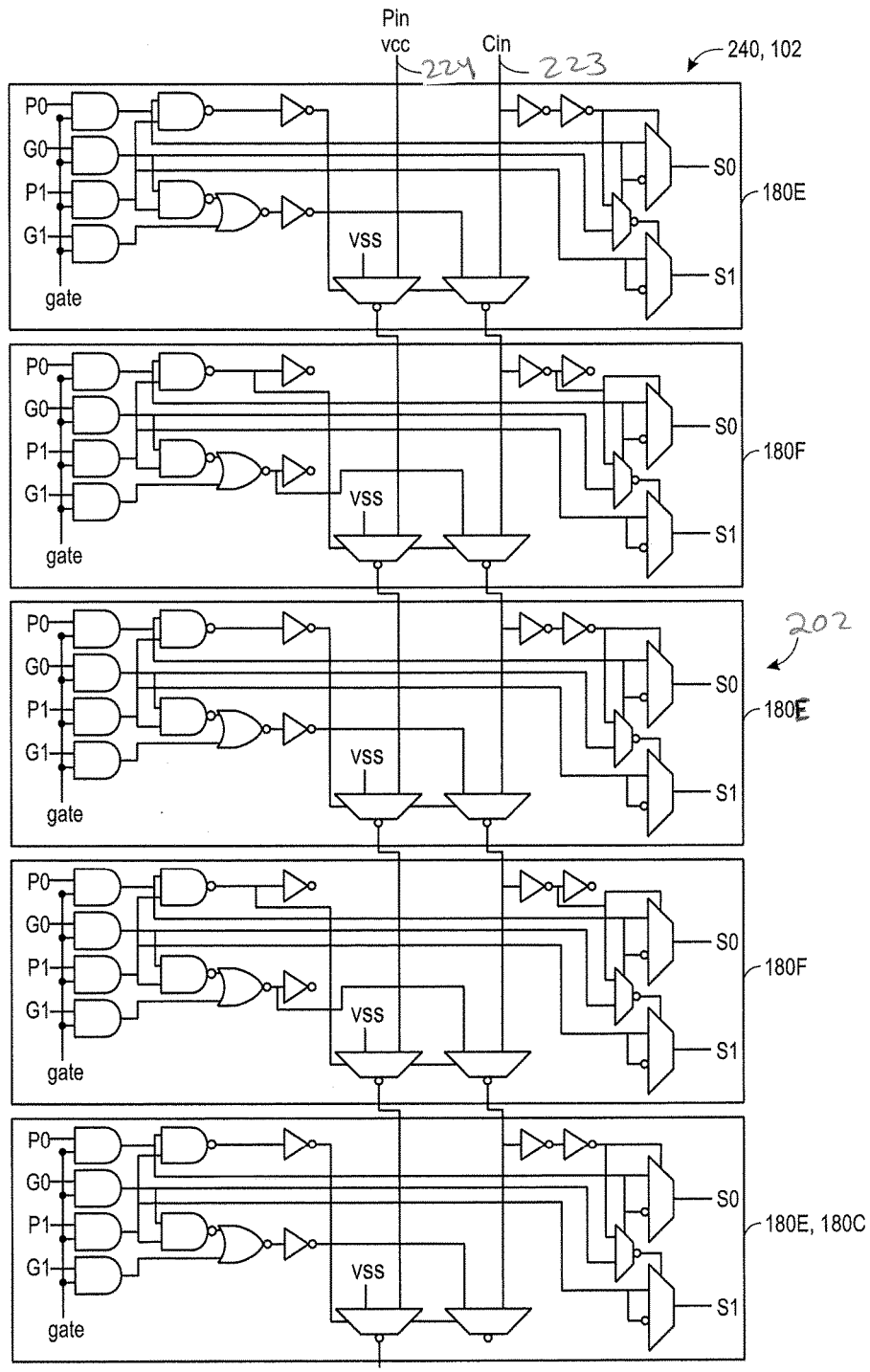
FIG. 12 is a block diagram of a second logic array structure, in accordance with an embodiment.

FIG. 12 illustrates a second logic array structure 240 implemented to include a number of adaptive logic modules 180, which may each be implemented using instance-based connectivity to construct a 2-bit carry skip structure. More specifically, the second logic array structure 240 may include a first set of adaptive logic modules 180E (e.g., even adaptive logic modules 180E) implemented to receive a non-inverted input and to produce an inverted (e.g., complemented) output and a second set of adaptive logic modules 180F (e.g., odd adaptive logic modules 180F) implemented to receive an inverted input and to produce a non-inverted output. Accordingly, an output of one of the first set of adaptive logic modules 180E may route into an input of one of the second set of adaptive logic modules 180F, and/or an output of one of the second set of adaptive logic modules logic modules 180F may route into an input of one of the first set of adaptive logic modules 180E. For example, as illustrated, the second logic array structure 240 may include adaptive logic modules 180E communicatively coupled to and interleaved with adaptive logic modules 180F. Further, it may be appreciated that one of the first set of adaptive logic modules 180E may include inverted logic compared to the logic of one of the second set of adaptive logic modules 180F, or vice versa.

Using a 2-bit carry skip structure, which may include a generate logic path 223 (e.g., hard logic path circuitry and/or routing circuitry), such as a carry-chain 222, and a propagate logic path 224 (e.g., hard logic path circuitry and/or routing circuitry), the second logic array structure 240 may be implemented to determine a sum. For example, as illustrated, the second logic array structure 240 may perform 2-bits of arithmetic (e.g., addition) at each adaptive logic module 180 to output two bits (e.g., S[1:0]) of the sum from each adaptive logic module 180. Moreover, the second logic array structure 240 may use instance-based connectivity, as described above, to communicatively couple the adaptive logic modules 180 in a carry structure such that a respective carry value (e.g., generate signal) resulting from the arithmetic operation performed at an adaptive logic module 180 may route into a subsequently coupled adaptive logic module 180. Further, in some embodiments, each of the adaptive logic modules 180 may include a gate signal (gate) implemented to control power gating to the respective adaptive logic module 180. More specifically, the gate signal may control the input propagate (e.g., P0 and P1) and generate signals (e.g., G0 and G1) to each adaptive logic module 180.

For simplicity, the illustrated adaptive logic modules 180 each receive P0, P1, G0, and G1. However, it may be appreciated that these inputs may correspond to the respective bit position of the corresponding adaptive logic module 180. For example, the P0 value received at the illustrated most significant adaptive logic module 180 may represent an eighth propagate input signal. Moreover, each of the sum positions (e.g., S0 and S1) may correspond to the respective bit position of the corresponding adaptive logic module 180. Thus, embodiments described herein are intended to be illustrative and not limiting.

Figure 13:
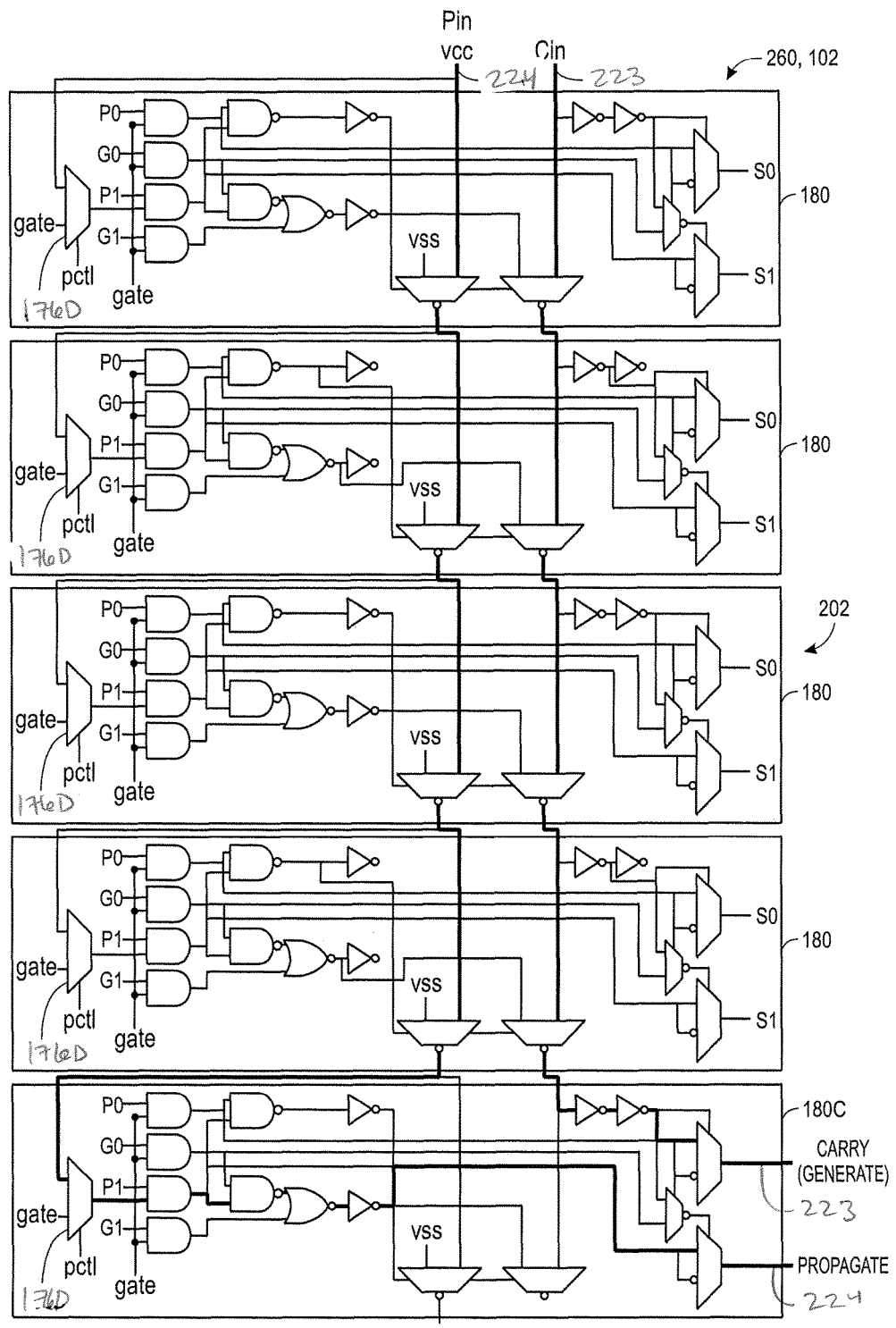
FIG. 13 is a block diagram of a third logic array structure, in accordance with an embodiment.

Turning now to FIG. 13, in some embodiments, the second logic array structure 240 may be modified to produce a third logic array structure 260, which may concurrently output the generate signal and the propagate signal. In some embodiments, the propagate logic path 224 may be formed between adaptive logic modules 180 to calculate and route a propagate signal or a portion of the propagate signal in the third logic array structure 260. Further, the third logic array structure 260 may use an additional power gating signal (pct1) to output the propagate signal. As such, the adaptive logic modules 180 may include a multiplexer 176D implemented to select between the propagate signal and the gate signal based in part on a state of the additional power gating signal (pct1). Accordingly, to output the propagate signal, the most significant adaptive logic module 180C may be implemented such that the additional power gating signal selects the propagate signal at the mux 176D, and the previous adaptive logic modules 180 may be implemented such that the additional power gating signal does not select the propagate signal at the mux 176D. To that end, the propagate signal and/or the portions of the propagate signal (e.g., ptop and/or pbot) may carry through the third logic array structure 260 via the adaptive logic modules 180. Moreover, at the most significant adaptive logic module 180C, may select the propagate signal, which may be calculated based in part on the portions of the propagate signal (e.g., ptob and/or pbot), to be fed into the P1 input position and to subsequently be output onto the S1 output of the most significant adaptive logic module 180C. Additionally or alternatively, in some embodiments, a lutmask may be applied to one or more of the adaptive logic modules 180 to generate the values of P0, P1, G0, and/or G1 in order to suitably route the propagate and/or generate signal without the use of the gate signal and/or the additional power gating signal (pct1).

As with the second logic array structure 240 of FIG. 12, the third logic array structure 260 of FIG. 13 may additionally include a generate logic path 223 implemented to output the generate signal. Accordingly, the carry-out value of an adaptive logic module 180 may carry into a subsequent adaptive logic module 180, and this process may be repeated until a carry value is routed into the most significant adaptive logic module 180C. At the most significant adaptive logic module 180C, the carry-out value of the entire arithmetic operation (e.g., addition) implemented by the third logic array structure 260 may be routed out at the S0 position of the most significant logic module 180C as the generate signal. Accordingly, the third logic array structure 260 may concurrently calculate and output a sum, the generate signal, and the propagate signal corresponding to an arithmetic operation, such as an addition operation.

Figure 14:
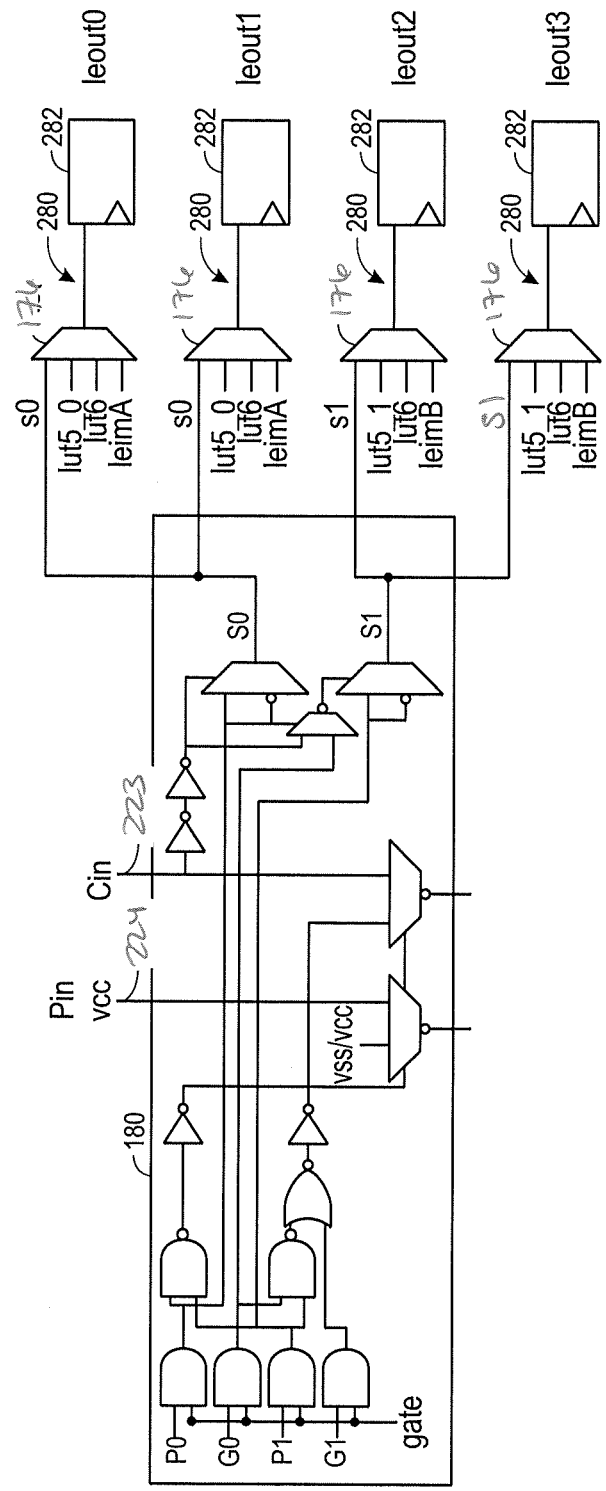
FIG. 14 is a block diagram of an adaptive logic module coupled by a first and second output to a number of output paths, in accordance with an embodiment.

Turning now to FIG. 14, the outputs (e.g., the S0 and/or the S1 output circuitry) of the adaptive logic modules 180 of the second logic array structure 240 of FIG. 12 and/or of the third logic array structure 260 of FIG. 13 may be routed into an output path 280 (e.g., output path circuitry). For example, as illustrated the output corresponding to the illustrated S0 position may be routed as an input of a number of inputs to a first mux 176A and as an input of an additional number of inputs to a second mux 176B. Further, each of the first and second mux 176 (e.g., 176A and 176B, respectively) may be communicatively coupled to a respective output register 282 (e.g., flip-flop register). Further, the output corresponding to the S1 position may be routed as an input to a third and a fourth mux 176 (e.g., 176C and 176D, respectively), which may each be implemented to select between a number of respective inputs. The third mux 176C and/or the fourth mux 176D may additionally be coupled to a respective output register 282. In some embodiments, however, a mux 176 of an output path 280 may bypass a corresponding output register 282 and/or the output path 280 may be implemented without an output register 282 such that an output is directly muxed (e.g., selected) onto a routing path.

Accordingly, with reference now to FIGS. 13 and 14, to output the generate signal and the propagate signal onto respective output paths 280, the most significant adaptive logic module 180C may route the generate signal to the output path 280 corresponding to the S0 output position and may route the propagate signal to the output path 280 corresponding to the S1 output position. Alternatively, the most significant logic module 180C may route propagate signal to the output path 280 corresponding to the S0 output position and may route the generate signal to the output path 280 corresponding to the S1 output position. Because each of the output paths 280 communicatively coupled to the outputs of the most significant adaptive logic module 180C may be consumed by the generate signal and the propagate signal, the most significant adaptive logic module 180 may not perform an arithmetic operation (e.g., addition). For example, in some embodiments, because the result of the arithmetic operation may not be routed out as an output of the most significant adaptive logic module 180C, the most significant adaptive logic module 180C may not be used to produce a sum value and/or to perform arithmetic.

Figure 15:
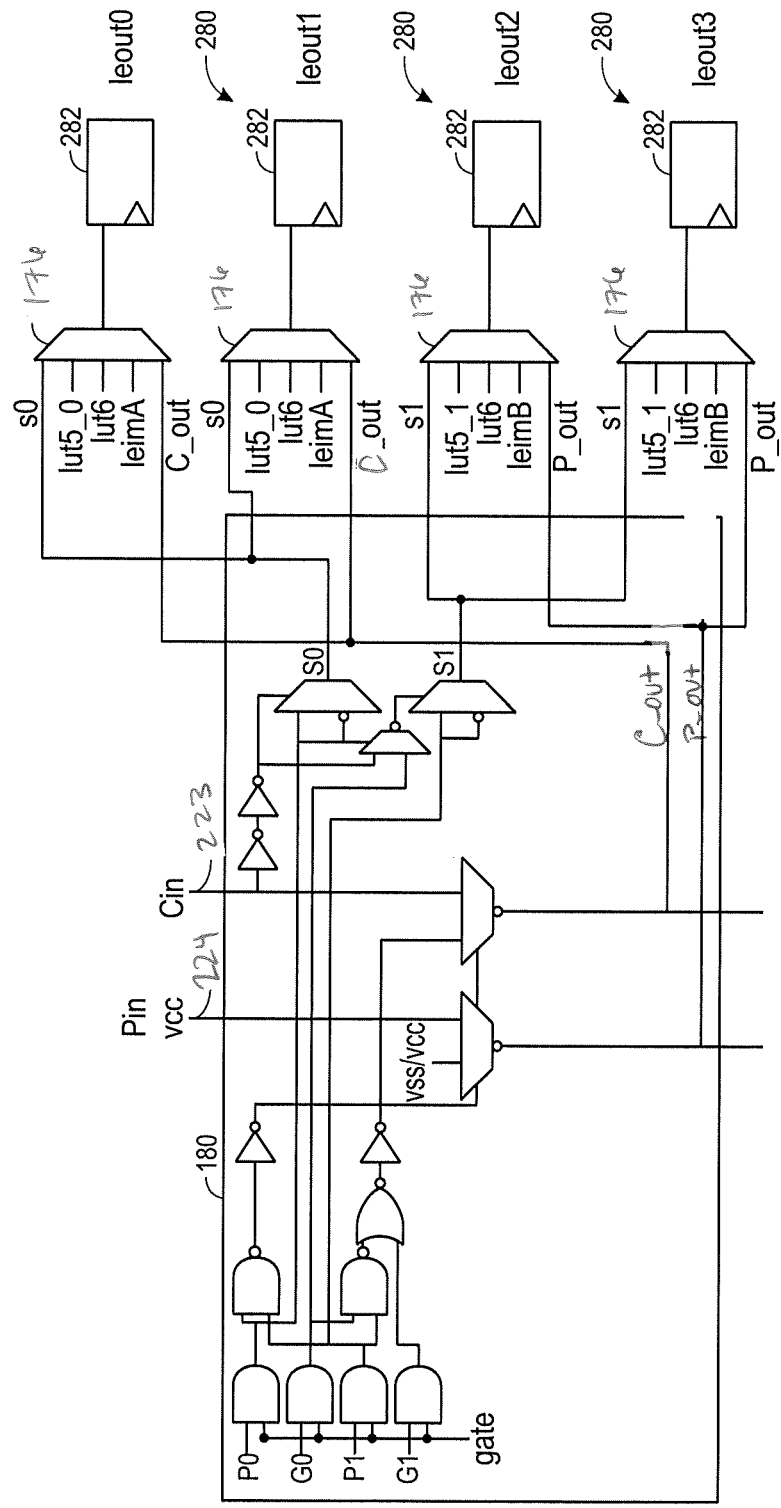
FIG. 15 is a block diagram of an adaptive logic module coupled to a number of output paths by a first and second output, a generate signal, and a propagate signal, in accordance with an embodiment.

In some embodiments, on the other hand, an adaptive logic module 180 may simultaneously output the generate signal, the propagate signal, and a number of bits corresponding to a result of an arithmetic operation, such as a sum, as illustrated in FIG. 15. More specifically, the generate signal may be routed directly from the generate logic path 223 and fed into an input of one or more muxes included in an output path 280. For example, as illustrated, the generate signal may be routed, along with the result of an arithmetic operation (e.g., a sum bit) corresponding to the output position of S0, to the first mux 176A and the second mux 176B. Accordingly, in some embodiments, one of the first mux 176A or the second mux 176B may be implemented to select the generate signal as an output to the corresponding output register 282 and/or directly to a routing path (e.g., bypassing the output register 282). The remaining mux 176 (e.g., 176A or 176B) may be implemented to select the result of the arithmetic operation, such as a sum value, as an output to the corresponding output register 282 and/or directly to a routing path. Accordingly, the generate signal and a sum may simultaneously be output to the output paths 280 communicatively coupled to the adaptive logic module 180. Moreover, the propagate signal may be routed, along with the result of an additional arithmetic operation (e.g., a sum bit) corresponding to the output position of S1, to the third mux 176C and the fourth mux 176D. Accordingly, in some embodiments, one of the third mux 176C or the fourth mux 176D may be implemented to select the propagate signal as an output to the corresponding output register 282 and/or directly to a routing path (e.g., bypassing the output register 282). The remaining mux 176 (e.g., 176A or 176B) may be implemented to select the result of the additional arithmetic operation, such as a sum value, as an output to the corresponding output register 282 and/or directly to a routing path. Accordingly, the generate signal, the propagate signal, and a number of sum bits (e.g., bits resulting from an arithmetic operation) may simultaneously be output to the output paths 280 communicatively coupled to the adaptive logic module 180.

Further, in some embodiments, the generate signal and/or the propagate signal may be routed to a respective output path 280 coupled to any of the adaptive logic modules 180 included in the second logic array structure 240, the third logic array structure 260, and/or in a logic array block 202. For example, the generate signal, the propagate signal, and/or an intermediate value of the generate and/or propagate signal, such as the first or second portion of the propagate signal, may be routed from a suitable adaptive logic module 180, such as the most significant adaptive logic module 180C, an adaptive logic module 180 between the least significant adaptive logic module 180 and the most significant adaptive logic module 180C, and/or the like. Accordingly, in some embodiments, the first portion of the propagate signal (ptop) may be routed out from an adaptive logic module 180 internal to the carry-chain (e.g., between the least significant adaptive logic module 180 and the most significant adaptive logic module 180C), for example, to a corresponding output path. Further, the second portion of the propagate signal (pbot) may be routed out from the most significant adaptive logic module 180C to an output path corresponding to the most significant adaptive logic module 180C. Accordingly, in such embodiments, the first and second portion of the propagate signal may be combined (e.g., logically ANDed) after being output from respective adaptive logic modules 180 to determine the propagate signal. Further, it may be appreciated that the generate signal and/or the propagate signal may be routed from any number of adaptive logic modules 180. Thus, the embodiments are intended to be illustrative and not limiting.

Moreover, any suitable logic array structure (e.g., 200, 240, 260, and/or the like) may be implemented to route the propagate signal and/or the generate signal out of an adaptive logic module 180 at any of a number of suitable bit positions. For example, the propagate signal and/or the generate signal may be routed out of an adaptive logic module 180 at any suitable bit position of the third arithmetic logic structure 260 of FIG. 13. Accordingly, embodiments described herein are intended to be illustrative and not limiting.

Figure 16:
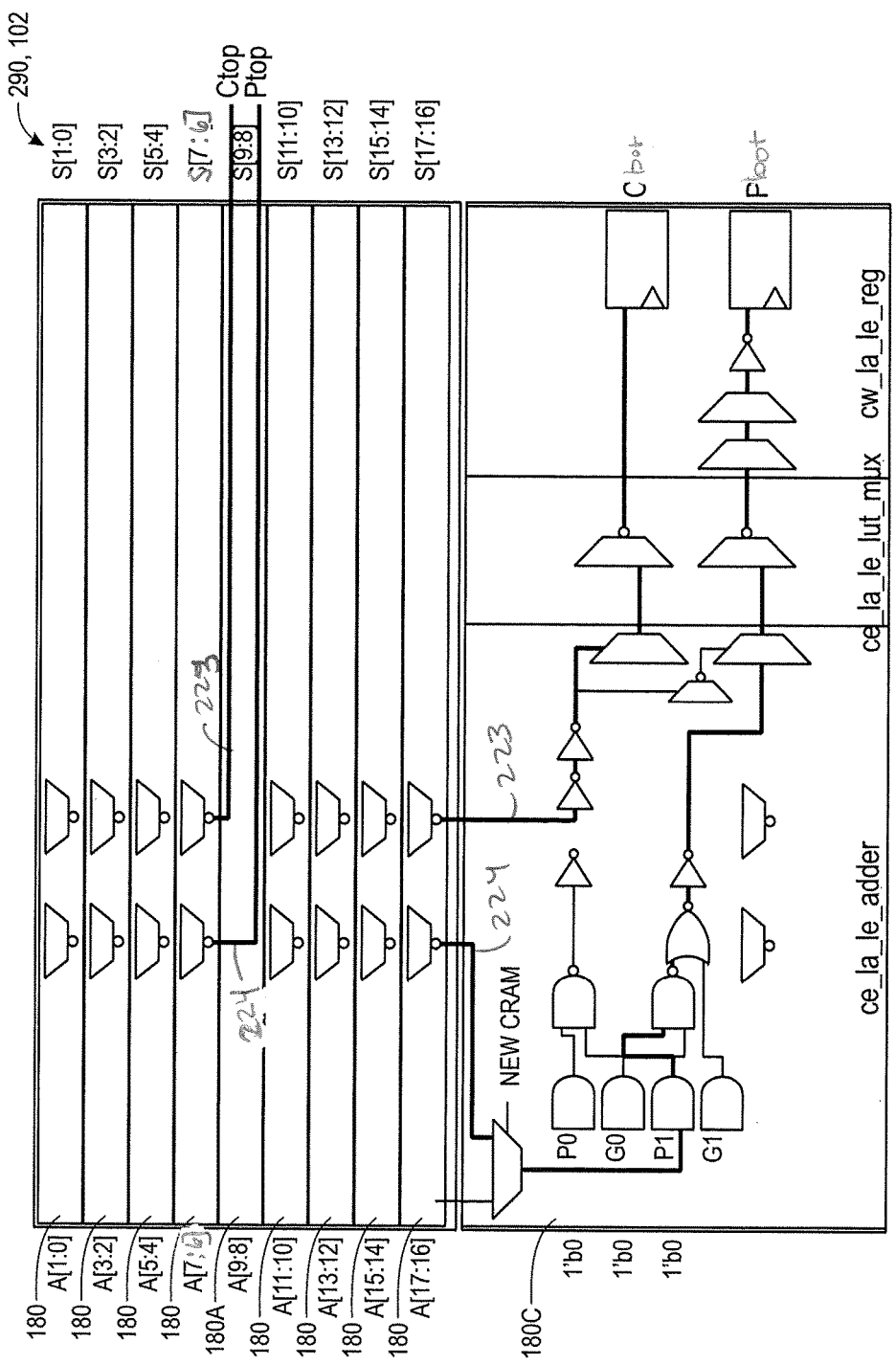
FIG. 16 is a block diagram of a fourth logic array structure, in accordance with an embodiment.

Moreover, FIG. 16 provides an illustrative embodiment of a fourth logic array structure 290 implemented to output a first portion of the propagate signal (ptop) and a first portion of the generate signal (ctop) using an adaptive logic module 180G corresponding to an eighth and a ninth arithmetic operation (e.g., a[9:8]). Further, the fourth logic array structure 290 may be implemented to output a second portion of the propagate signal (pbot) and a second portion of the generate signal (cbot) using the most significant adaptive logic module 180C. In contrast with the adaptive logic module 180 of FIG. 15, each of the adaptive logic module 180G and the most significant adaptive logic module 180C may use each of the output positions (e.g., S0 and S1) to route a corresponding portion of the generate and/or propagate signal. For example, each of the adaptive logic module 180G and the most significant adaptive logic module 180C may respectively provide two outputs (e.g., a propagate signal output and a generate signal output), while the adaptive logic module 180 of FIG. 15, which may be implemented to perform an arithmetic operation in addition to routing out a propagate signal and a generate signal, may output four outputs (e.g., the generate signal, the propagate signal, a first arithmetic operation result, and a second arithmetic operation result). Accordingly, FIG. 16 may correspond to a modified embodiment of the third logic array structure 260 of FIG. 13.

While embodiments described herein may be described as having operand segment precisions determined based in part on a precision of the integrated circuit device 12, in some embodiments, the operand segment precisions used at the restructured adder 160 may be determined based in part on precisions that may fit naturally into the integrated circuit device, which may depend on the area of the integrated circuit device 12 at which the restructured adder 160 is implemented. For example, an operand segment may include 13 bits, 19 bits, and/or the like to enable easier placement on the integrated circuit device 12 and/or more efficient generation and/or construction of the restructured adder 160. Further, in some embodiments, operand segments received at different decoders of the restructured adder 160 may include a different number of bits. Moreover, in some embodiments, the precision of the operand segments may depend on the implementation of the sub-adders 102, which may include any suitable combination of the techniques described herein. Accordingly, the embodiments described herein are intended to be illustrative, and not limiting.

Figure 17:
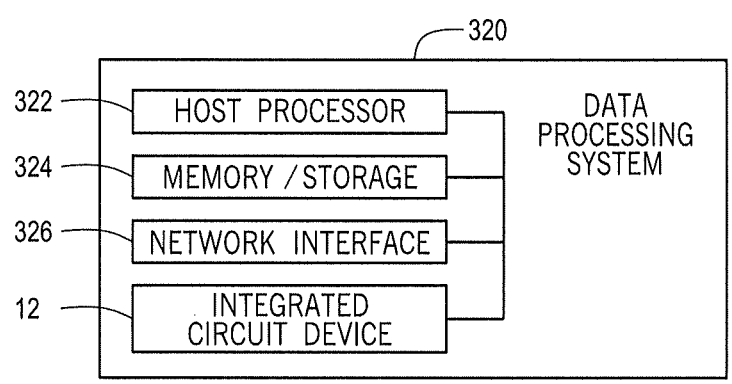
FIG. 17 is a block diagram of a data processing system, in accordance with an embodiment.

The integrated circuit device 12 may be, or may be a component of, a data processing system. For example, the integrated circuit device 12 may be a component of a data processing system 320, shown in FIG. 17. The data processing system 320 may include a host processor 322, memory and/or storage circuitry 324, and a network interface 326. The data processing system 320 may include more or fewer components (e.g., electronic display, user interface structures, application specific integrated circuits (ASICs)). The host processor 322 may include any suitable processor, such as an INTEL® Xeon® processor or a reduced-instruction processor (e.g., a reduced instruction set computer (RISC), an Advanced RISC Machine (ARM) processor) that may manage a data processing request for the data processing system 320 (e.g., to perform encryption, decryption, machine learning, video processing, voice recognition, image recognition, data compression, database search ranking, bioinformatics, network security pattern identification, spatial navigation, or the like). The memory and/or storage circuitry 324 may include random access memory (RAM), read-only memory (ROM), one or more hard drives, flash memory, or the like. The memory and/or storage circuitry 324 may hold data to be processed by the data processing system 320. In some cases, the memory and/or storage circuitry 324 may also store configuration programs (bitstreams) for programming the integrated circuit device 12. The network interface 326 may allow the data processing system 320 to communicate with other electronic devices. The data processing system 320 may include several different packages or may be contained within a single package on a single package substrate.

In one example, the data processing system 320 may be part of a data center that processes a variety of different requests. For instance, the data processing system 320 may receive a data processing request via the network interface 326 to perform encryption, decryption, machine learning, video processing, voice recognition, image recognition, data compression, database search ranking, bioinformatics, network security pattern identification, spatial navigation, or some other specialized task. The host processor 322 may cause the programmable logic fabric of the integrated circuit device 12 to be programmed with an adder suitable to implement a requested task. For instance, the host processor 322 may instruct that a configuration data (bitstream) stored on the memory and/or storage circuitry 324 to be programmed into the programmable logic fabric of the integrated circuit device 12. The configuration data (bitstream) may represent a circuit design for an adder, such as a restructured adder 160, which may be mapped to the programmable logic according to the techniques described herein, to efficiently perform and/or compute the requested task. By efficiently mapping the adder to the programmable logic and/or efficiently implementing the sub-adders of the adder in circuitry, such as implementing the sub-adders to concurrently output a generate signal, a propagate signal, and a sum, which may reduce routing and area resources used to perform the requested task that may involve large arithmetic operations, the integrated circuit device 12 may rapidly assist the data processing system 320 in performing the requested task.

While the embodiments set forth in the present disclosure may be susceptible to various modifications and alternative forms, specific embodiments have been shown by way of example in the drawings and have been described in detail herein. For example, any suitable combination of the embodiments and/or techniques described herein may be implemented. Accordingly, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:
1. Adder circuitry on an integrated device, the adder circuitry comprising:
  input circuitry configured to receive a first input and a second input;
  first arithmetic logic circuitry communicatively coupled to the input circuitry, wherein the first arithmetic logic circuitry is configured to:

determine a first sum of a first bit of the first input and a first bit of the second input; and determine a propagate signal and a generate signal based at least in part on the first sum; and output circuitry communicatively coupled to the first arithmetic logic circuitry, wherein the output circuitry is configured to concurrently output the generate signal, the propagate signal, and the first sum.

2. The adder circuitry of claim 1, comprising second arithmetic logic circuitry communicatively coupled to the input circuitry, wherein the second arithmetic logic circuitry comprises propagate logic path circuitry and generate logic path circuitry, and wherein the second arithmetic logic circuitry is configured to:

determine a second sum of a second bit of the first input and a second bit of the second input;

determine an additional propagate signal and an additional generate signal based at least in part on the second sum;

route the additional propagate signal to the propagate logic path circuitry; and route the additional generate signal to the generate logic path circuitry.

3. The adder circuitry of claim 2, wherein the first arithmetic logic circuitry is communicatively coupled to the propagate logic path circuitry and the generate logic path circuitry, and wherein the first arithmetic logic circuitry is configured to:

receive the additional propagate signal via the propagate logic path circuitry;

receive the additional generate signal via the generate logic path circuitry;

determine the propagate signal based at least in part on the additional propagate signal; and determine the generate signal based at least in part on the additional generate signal.

4. The adder circuitry of claim 3, wherein the first arithmetic logic circuitry is communicatively coupled to the generate logic path circuitry via instance-based connectivity.

5. The adder circuitry of claim 1, comprising output path circuitry communicatively coupled to the output circuitry, wherein the output path circuitry comprises a multiplexer configured to receive the first sum and one of the generate signal or the propagate signal.

6. The adder circuitry of claim 1, comprising:

second arithmetic logic circuitry communicatively coupled to the input circuitry, wherein the second arithmetic logic circuitry is configured to:

determine a second sum of a second bit of the first input and a second bit of the second input; and determine an additional propagate signal based at least in part on the second sum; and additional output circuitry communicatively coupled to the second arithmetic logic circuitry, wherein the output circuitry is configured to concurrently output the additional propagate signal and the second sum.

7. The adder circuitry of claim 1, wherein the propagate signal comprises a first portion of an additional propagate signal, wherein the first arithmetic logic circuitry is configured to receive a second portion of the additional propagate signal, and wherein the first arithmetic logic circuitry is configured to calculate the additional propagate signal based at least in part on a logical AND of the first and second portion of the additional propagate signal.

8. The adder circuitry of claim 1, wherein the generate signal comprises a carry-out signal resulting from the first sum.

9. The adder circuitry of claim 1, wherein the first arithmetic logic circuitry is configured to determine the propagate signal independently from the generate signal.

10. The adder circuitry of claim 1, wherein the output circuitry comprises first output circuitry and second output circuitry, wherein the first output circuitry is configured to concurrently output a first portion of the generate signal and a first portion of the propagate signal, and wherein the second output circuitry is configured to concurrently output a second portion of the propagate signal and a second portion of the generate signal.

11. The adder circuitry of claim 1, comprising a carry skip structure, wherein the carry skip structure comprises propagate logic path circuitry and generate logic path circuitry.

12. The adder circuitry of claim 11, wherein the generate logic path circuitry comprises carry-chain circuitry.

13. The adder circuitry of claim 11, wherein the propagate logic path circuitry comprises selection circuitry.

14. The adder circuitry of claim 1, wherein the integrated device comprises a field-programmable gate array.

15. Adder circuitry on an integrated circuit device, the adder circuitry comprising:

first input circuitry configured to receive a first input having a first set of bits;

second input circuitry configured to receive a second input having a second set of bits;

first sub-adder circuitry coupled to the first input circuitry and to the second input circuitry, wherein the first sub-adder circuitry is configured to receive a first subset of the first set of bits and a first subset of the second set of bits and to concurrently determine a generate signal, a propagate signal, and a first sum of the first subset of the first set of bits and the first subset of the second set of bits based at least in part on the first subset of the first set of bits and the first subset of the second set of bits;

a prefix network coupled to the first sub-adder circuitry, wherein the prefix network is configured to determine a carry out signal based at least in part on the generate signal and the propagate signal, wherein the prefix network comprises first combinatorial circuitry; and second combinatorial circuitry coupled to the prefix network, wherein the second combinatorial circuitry is configured to determine a portion of a second sum of the first set of bits and the second set of bits based at least in part on the carry out signal.

16. The adder circuitry of claim 15, wherein the second combinatorial circuitry comprises second sub-adder circuitry coupled to the first sub-adder circuitry and the prefix network and configured to add the first sum and the carry out signal to determine the portion of the second sum of the first set of bits and the second set of bits.

17. The adder circuitry of claim 15, wherein a topology of the prefix network comprises a Kogge-Stone topology, a Brent-Kung topology, a Sklansky topology, or a combination thereof.

18. The adder circuitry of claim 15, wherein the first sub-adder circuitry is configured to determine a first portion of the propagate signal and a second portion of the propagate signal based at least in part on the first subset of the first set of bits and the first subset of the second set of bits, and wherein the first sub-adder circuitry is configured to determine the propagate signal based at least in part on the first portion of the propagate signal and the second portion of the propagate signal.

19. A tangible, non-transitory, machine-readable medium, comprising machine-readable instructions to construct adder circuitry that, when executed by one or more processors, cause the one or more processors to:
- configure input circuitry to receive a first input and a second input;
- configure arithmetic logic circuitry communicatively coupled to the input circuitry, wherein configuring the arithmetic logic circuitry comprises configuring the arithmetic logic circuitry to:
  - determine a sum of a first bit of the first input and a first bit of the second input; and
  - determine a propagate signal and a generate signal based at least in part on the sum; and
- configure output circuitry communicatively coupled to the arithmetic logic circuitry to concurrently output the generate signal, the propagate signal, and the sum.

20. The tangible, non-transitory, machine-readable medium of claim 19, wherein the arithmetic logic circuitry comprises the output circuitry, and wherein the machine-readable instructions, when executed by one or more processors, cause the one or more processors to:
- configure a multiplexer of output path circuitry communicatively coupled to the arithmetic logic circuitry to receive the sum and one of the generate signal or the propagate signal.

* * * * *